United States Patent [19]

Yasukawa et al.

[11] Patent Number: 5,700,084
[45] Date of Patent: Dec. 23, 1997

[54] OPTICAL SOURCE POSITION ADJUSTMENT DEVICE

[75] Inventors: Manabu Yasukawa; Chiyoharu Horiguchi; Musubu Koishi, all of Hamamatsu, Japan

[73] Assignee: Hamamatsu Photonics K.K., Shizuoka-ken, Japan

[21] Appl. No.: 697,351

[22] Filed: Aug. 22, 1996

[30] Foreign Application Priority Data

Aug. 22, 1995 [JP] Japan ................... P7-213581

[51] Int. Cl.⁶ ........................................... F21V 21/28
[52] U.S. Cl. ................... 362/275; 362/268; 362/271; 362/276; 362/287; 362/428; 356/139.05; 356/141.3
[58] Field of Search ................... 250/201.8, 548, 250/559.29, 559.3; 356/139.04, 139.05, 139.06, 139.08, 141.3; 359/159; 362/268, 233, 271, 272, 275, 276, 287, 419, 428, 802

[56] References Cited

U.S. PATENT DOCUMENTS

| | | | |
|---|---|---|---|
| 4,867,560 | 9/1989 | Kunitsugu | 356/141.3 |
| 4,870,263 | 9/1989 | Deutsch | 250/204 |
| 4,947,030 | 8/1990 | Takahashi | 362/268 |
| 5,047,609 | 9/1991 | Ekstrand | 356/139.05 |
| 5,064,285 | 11/1991 | Iddan | 356/139.05 |
| 5,224,052 | 6/1993 | Hamar | 356/141.3 |

FOREIGN PATENT DOCUMENTS

| | | |
|---|---|---|
| 59-113532 | 6/1984 | Japan . |
| 62-62226 | 3/1987 | Japan . |
| 34858 | 1/1991 | Japan . |
| 4220536 | 8/1992 | Japan . |
| 5288638 | 11/1993 | Japan . |
| 75032 | 1/1995 | Japan . |
| 2218874 | 11/1989 | United Kingdom ............ 359/159 |

*Primary Examiner*—Alan Cariaso
*Attorney, Agent, or Firm*—Sughrue, Mion, Zinn, Macpeak & Seas, PLLC

[57] ABSTRACT

In the light-source position adjustment device, a magnification lens 31 magnifies a light bundle emitted from a light source 50. A half mirror 32 guides the light bundle outputted from the magnification lens system toward the first and second optical paths. An angular shift measuring portion is disposed in the first optical path for detecting emission angle intensity distribution of the light source. A position shift measuring portion is disposed in the second optical path for detecting a magnification image of the light source which is produced on an image plane of the magnification lens. The light source 50 is disposed on a multi-axes stage unit 10 which is driven by a stage drive unit 20. A control portion 40 receives output signals from the angular shift measuring portion and the position shift measuring portion, and determines an amount by which a light-emission direction shifts from the predetermined standard direction and an amount by which a light-generating point of the light source is displaced from the standard position. The control portion 40 outputs control signals to the stage drive unit. Receiving the control signals, the stage drive unit 20 drives the multi-axes state unit 10 so that the light-emission direction be aligned with the standard direction and so that the light-generating point be located on the standard position.

8 Claims, 15 Drawing Sheets

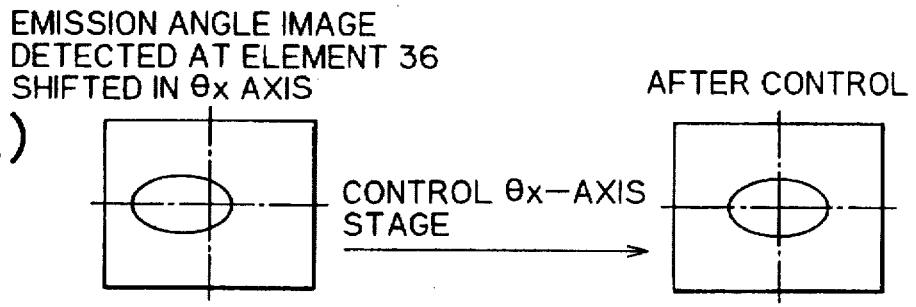

FIG. 5(a) EMISSION ANGLE IMAGE DETECTED AT ELEMENT 36 SHIFTED IN θx AXIS → CONTROL θx-AXIS STAGE → AFTER CONTROL

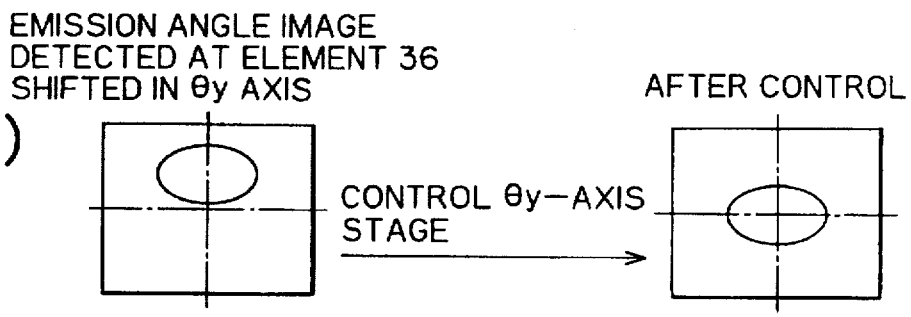

FIG. 5(b) EMISSION ANGLE IMAGE DETECTED AT ELEMENT 36 SHIFTED IN θy AXIS → CONTROL θy-AXIS STAGE → AFTER CONTROL

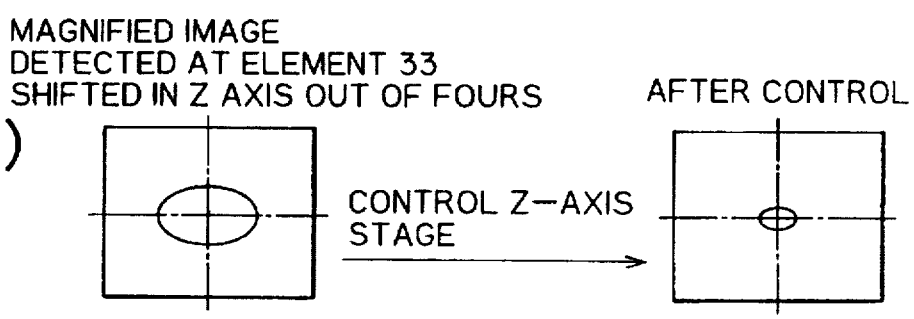

FIG. 5(c) MAGNIFIED IMAGE DETECTED AT ELEMENT 33 SHIFTED IN Z AXIS OUT OF FOURS → CONTROL Z-AXIS STAGE → AFTER CONTROL

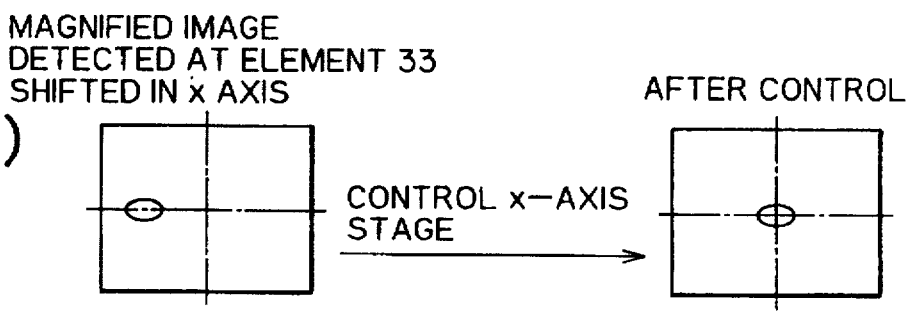

FIG. 5(d) MAGNIFIED IMAGE DETECTED AT ELEMENT 33 SHIFTED IN x AXIS → CONTROL x-AXIS STAGE → AFTER CONTROL

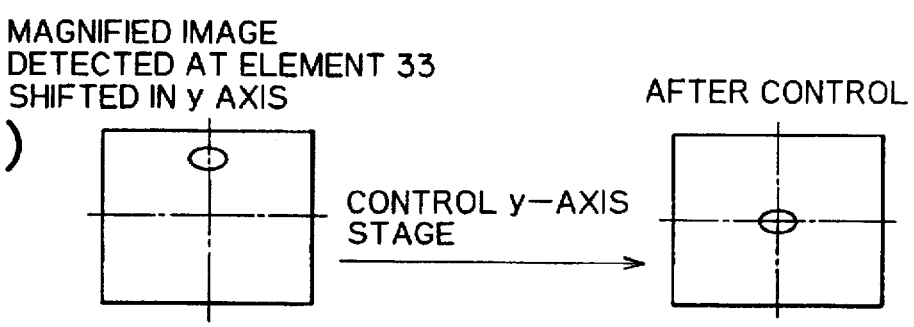

FIG. 5(e) MAGNIFIED IMAGE DETECTED AT ELEMENT 33 SHIFTED IN y AXIS → CONTROL y-AXIS STAGE → AFTER CONTROL

FIELD OF WIDE RANGE PICK UP ELEMENT 87(87a)

FIELD OF NARROW RANGE PICK UP ELEMENT 88(88a)

OPTICAL SOURCE POSITION ADJUSTMENT DEVICE

BACKGROUND OF THE INVENTION

1. Field of the Invention

The present invention relates to a device for adjusting position of a light source so that a light-generating point be located on a predetermined standard position and so that the light source emit light along a predetermined standard direction.

2. Description of the Related Art

When assembling a semiconductor laser device, a semiconductor laser chip is mounted to a housing at a final stage of the assembly. The housing is provided with a heat-discharging plate. The relative position of the semiconductor laser center and the housing center is mechanically adjusted so that the semiconductor laser center is properly located on the center of the housing. This method is applied based on the assumptions that a light-generating point is located on the center of the semiconductor laser and that the semiconductor laser emits light in a direction normal to the light-emitting surface of the semiconductor laser chip.

It is noted, however, that the light-emitting point is often shifted from the center of the semiconductor laser. Also, the direction, in which the semiconductor laser emits light, is shifted from normal to the light-emitting surface. For these reasons, it is difficult to properly and precisely mount the semiconductor laser onto the housing. This can result in poor yield and in high manufacturing costs.

The semiconductor laser is seldom used by itself and is often used combined with other optical components, such as lenses and optical fibers. Operability of the overall optical system is greatly influenced from the positional relationship between the semiconductor laser and the other optical components. It is therefore extremely important to properly and precisely locate the light-generating point relative to the other optical components. It is also extremely important to properly and precisely adjust the light-emission direction relative to the other optical components. However, positional adjustment of the semiconductor laser and the other optical components is a very delicate and time consuming operation.

SUMMARY OF THE INVENTION

In the future, optical fibers will be used extensively in an optical network for connecting individual households. In this case, a signal transmission terminal located at each household will need to be provided with an optical system which includes a semiconductor laser and a lens system. A fiber connector including a lens system will therefore be connected to a terminal end of an optical fiber cable provided to each household. A semiconductor laser will be provided within the fiber connector. It is therefore desirable to automatically center the semiconductor laser within the fiber connector.

Typically, the semiconductor laser has to be mounted within the fiber connector with a precision wherein a shift angle formed between the light emission direction of the semiconductor laser and the optical axis of the optical fiber is within about 1° or less and wherein the light-generating point is shifted from the core center of the optical fiber by only about ±0.5 μm or less.

In view of the above-described demands, a device is conceivable to measure the light-emitting condition of the semiconductor laser before the semiconductor laser is combined with another component. The device measures the position of the light-generating point and the light-emission direction. Based on the measured data, the device adjusts the position of the semiconductor laser relative to the component before the semiconductor laser is combined with that component.

Japanese Patent Application (KOKAI) No. HEI-7-5032 discloses an example of a semiconductor laser evaluation device for simultaneously measuring the light-emission direction and the light-generating position of a semiconductor laser. In this evaluation device, a half mirror is provided to divide light emitted from a semiconductor laser. One of the resultant light rays passes through an objective lens before being picked up by a CCD camera. The CCD camera detects an image of the light-generating point, and determines whether the light-generating point is shifted from a predetermined standard position. The other light ray is detected by a scanning optical sensor. The scanning optical sensor measures an angular distribution in the intensity of the semiconductor laser. Based on the measured results, the sensor determines whether the light-emission direction is shifted from a predetermined axis.

The present inventors have conceived to provide a method of adjusting the position of the semiconductor laser while detecting the light-generating point position and the light-emission direction with the use of the above-described semiconductor laser evaluation device.

According to this method, as shown in FIG. 1, the semiconductor laser is first mounted to a position adjustment device in S301. Next, the semiconductor laser is turned on so that it emits light. Light emitted from the semiconductor laser falls incident on the half mirror of the semiconductor laser evaluation device. During a first set of processes performed in S302 through S304, a part of the light passing through the half mirror is detected by the CCD camera. The CCD camera picks up an image of the light-generating point. The position of the light-generating point is calculated in S302 based on the pick-up data outputted from the CCD camera. Then, the position of the semiconductor laser is feedback adjusted in X, Y, and Z axial directions in S303 and S304 so that the light-generating point coincides with the predetermined standard position.

Next, during a second set of processes performed in S305 through S307, light reflected from the half mirror is detected by the optical sensor. The optical sensor is moved along an X-Z plane to one dimensionally measure the angular distribution of the emitted light along the X-Z plane. The optical sensor is then moved along a Y-Z plane to one dimensionally measure the angular distribution of the emitted light in the Y-Z plane. These two sets of measured values are used in S305 to determine the beam-emission direction in terms of shift angle values $\Theta_x$ and $\Theta_y$ defined as open angles between the light-emission direction and a predetermined standard axis along the X-Z and Y-Z planes. Then, in S306 and S307, the semiconductor laser is feedback rotated along the $\Theta_x$ and $\Theta_y$ axes so that the light-emission direction coincides with the predetermined standard direction.

With the semiconductor laser evaluation device of the above-described document, however, the above-described processes will fail to properly match the origin of the $\Theta_x$ and $\Theta_y$ axes with the light-generating surface of the semiconductor laser chip. Accordingly, the first set of processes are performed again as a third set of processes S308 through S310 to locate the position of the semiconductor laser at the standard point. Afterward, adjustment of the semiconductor laser is completed in S311.

In the above-described method, the light angle distribution is measured while the optical sensor is moved. Therefore, when an angular shift exists in the light-emission direction of the semiconductor laser, it is difficult to judge whether the angular shift is caused by merely an angular shift in the emission direction or by a shift of the light-generating point from the standard point. Accordingly, precise evaluation is impossible. Accordingly, the positional shift control processes must be performed both before end after the angular shift control processes. Therefore, it is difficult to quickly adjust position of the semiconductor laser.

Further, a relatively long time is required to move the optical sensor when measuring the angular shift in this way. As a result, adjusting the position of the semiconductor laser becomes also time consuming. When the brightest point of the semiconductor laser is outside the scanning range of the optical sensor, the angular shift can not be detected.

It is further noted that actually constructing the above-described semiconductor laser evaluation device would provide difficulty for the following reasons.

In the optical system, the half mirror is disposed between the semiconductor laser and the objective lens. A typical semiconductor laser has an emission angle of ±15° in the horizontal direction and ±40° in the vertical direction when measured as a half band width. Accordingly, it is necessary to employ an objective lens with a numerical aperture of about 0.7. If an objective lens provided in a typical microscope is employed, the gap between the semiconductor laser and the objective lens will be 5 mm at the greatest. This would allow insufficient space to dispose a half mirror. Even if a half mirror could be disposed between the semiconductor laser and the objective lens, there is a possibility that the scanning range of the optical sensor would interfere with the semiconductor laser locating position.

On the other hand, an objective lens that allows use of the half mirror between the laser and the lens would need to be large. The overall device would become larger and heavier as a result. Also, the cost of the lens itself increases greatly when the outer diameter of the lens increases. When the half mirror is disposed behind the objective lens so that the lens is between the half mirror and the semiconductor laser, the scanning position of the optical sensor would have to be to the rear of the half mirror. Accordingly, the optical sensor would have to be scanned along the back focal plane of the objective lens. The objective lens would therefore require a long back focus, that is, a long focal distance. Accordingly, the objective lens must be a large lens having a large numerical aperture. When the large lens is employed, however, the optical sensor will need to be scanned over a broad range.

It is therefore an objective of the present invention to overcome the above-described problems and to provide a device capable of quickly and accurately positioning a light source, such as a semiconductor laser, and capable of aligning the light-emitting direction of the light source with a predetermined standard optical axis and locating the light-generating point on a predetermined standard position.

In order to attain the object and other various objects, the present invention provides a light-source position adjustment device for aligning, with a predetermined standard direction, a direction in which a light source emits light and for positioning a light emission point on a predetermined standard position, the device comprising: a magnification lens system for magnifying a light bundle emitted from a light source; first optical path setting means for guiding a light bundle magnified at the magnification lens system toward first and second optical paths; angular shift measuring means disposed in the first optical path and for detecting emission angle intensity distribution of the light source; position shift measuring means disposed in the second optical path and for detecting a magnification image of the light source produced on an image plane of the magnification lens; a multi-axes stage unit for producing parallel movement and swinging movement of the light source; stage drive means for transmitting a drive signal to the multi-axes stage unit; and control means for determining, based on an output signal from the angular shift measuring means, an amount that a direction in which the light source emits light shifts from the predetermined standard direction and for determining, based on an output signal from the position shift measuring means, an amount that a light-generating point of the light source is displaced from the standard position, the control means outputting control signals to the stage drive means.

BRIEF DESCRIPTION OF THE DRAWINGS

The above and other objects, features and advantages of the invention will become more apparent from reading the following description of the preferred embodiment taken in connection with the accompanying drawings in which:

FIGS. 5(a) and 5(b) show the situation how the light-emission direction is adjusted to coincide with a standard direction;

FIGS. 5(c) through 5(e) show the situation how the light-emission point is adjusted to coincide with a standard position;

DETAILED DESCRIPTION OF THE PREFERRED EMBODIMENTS

Figure 1:
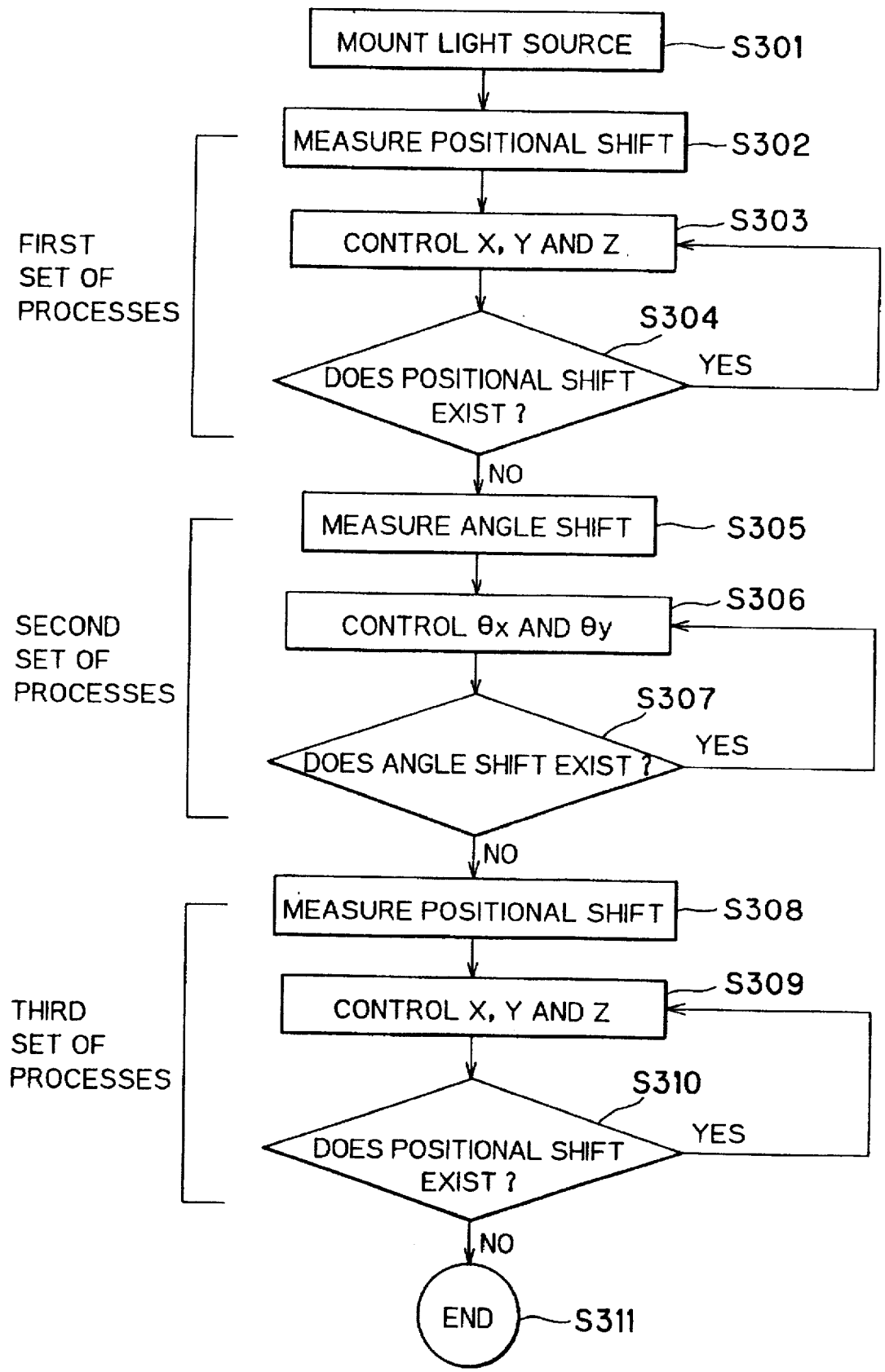
FIG. 1 is a flowchart showing the present inventors' conceived method of adjusting a position of a semiconductor laser.

A light source positional adjustment device according to preferred embodiments of the present invention will be described while referring to the accompanying drawings wherein like parts and components are designated by the same reference numerals to avoid duplicating description.

A first embodiment of the light source positional adjustment device will be described below with reference to FIGS. 2 through 5.

Figure 2:
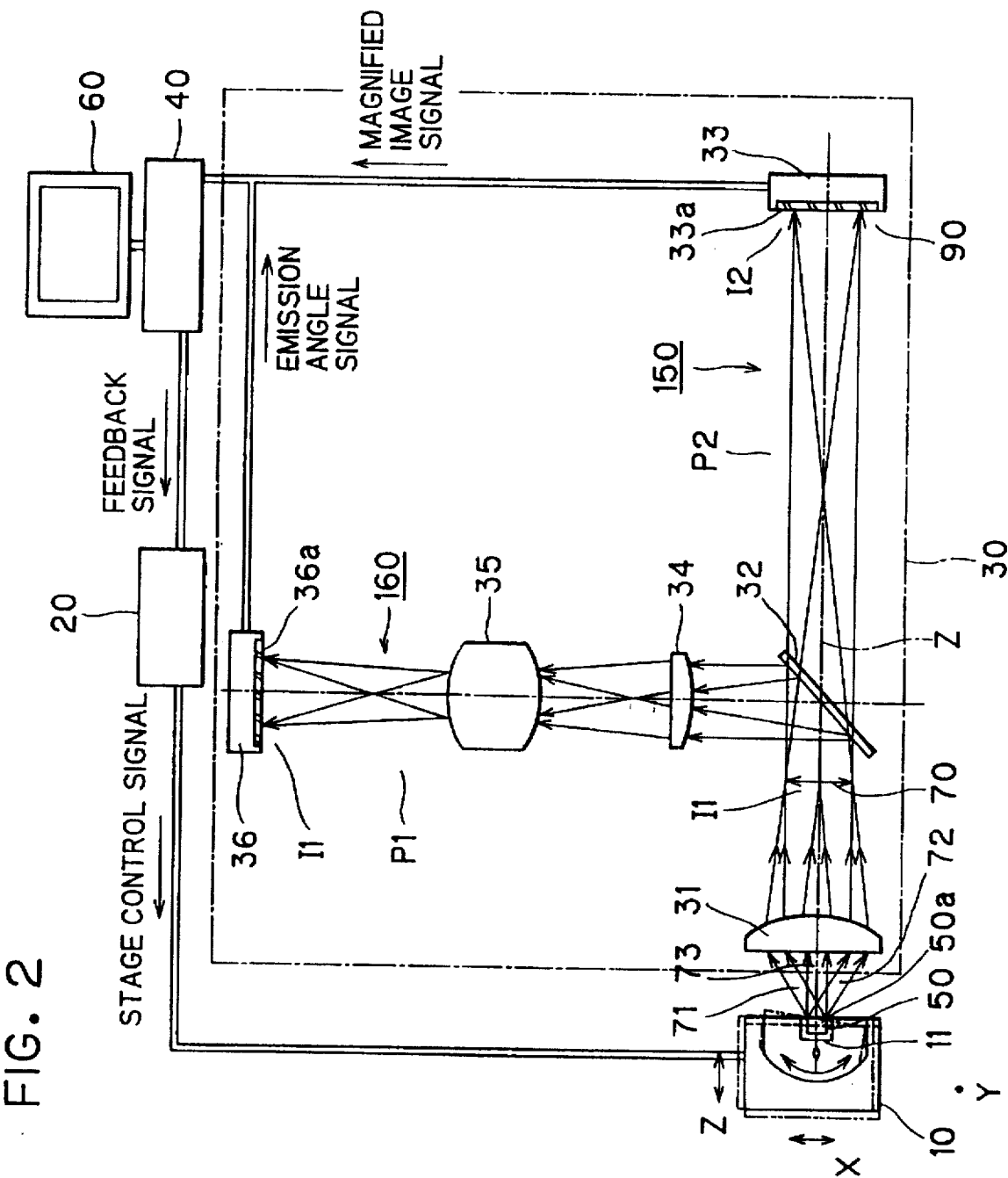
FIG. 2 is a schematic plan view showing a light source positional adjustment device according to a first embodiment of the present invention.

FIG. 2 is a schematic view showing the light source positional adjustment device according to the first embodiment. The light source positional adjustment device includes a multi-axes stage device 10, a stage drive device 20, a measurement optical system 30, a control portion 40, and a display device 60.

The multi-axes stage device 10 is for adjusting the position of a light source 50. The light source 50 has a light-generating point 50a. The light source 50 emits light from the light-generating point 50a in a light-emission direction. In this example, the light source 50 is a semiconductor laser.

Figure 3:
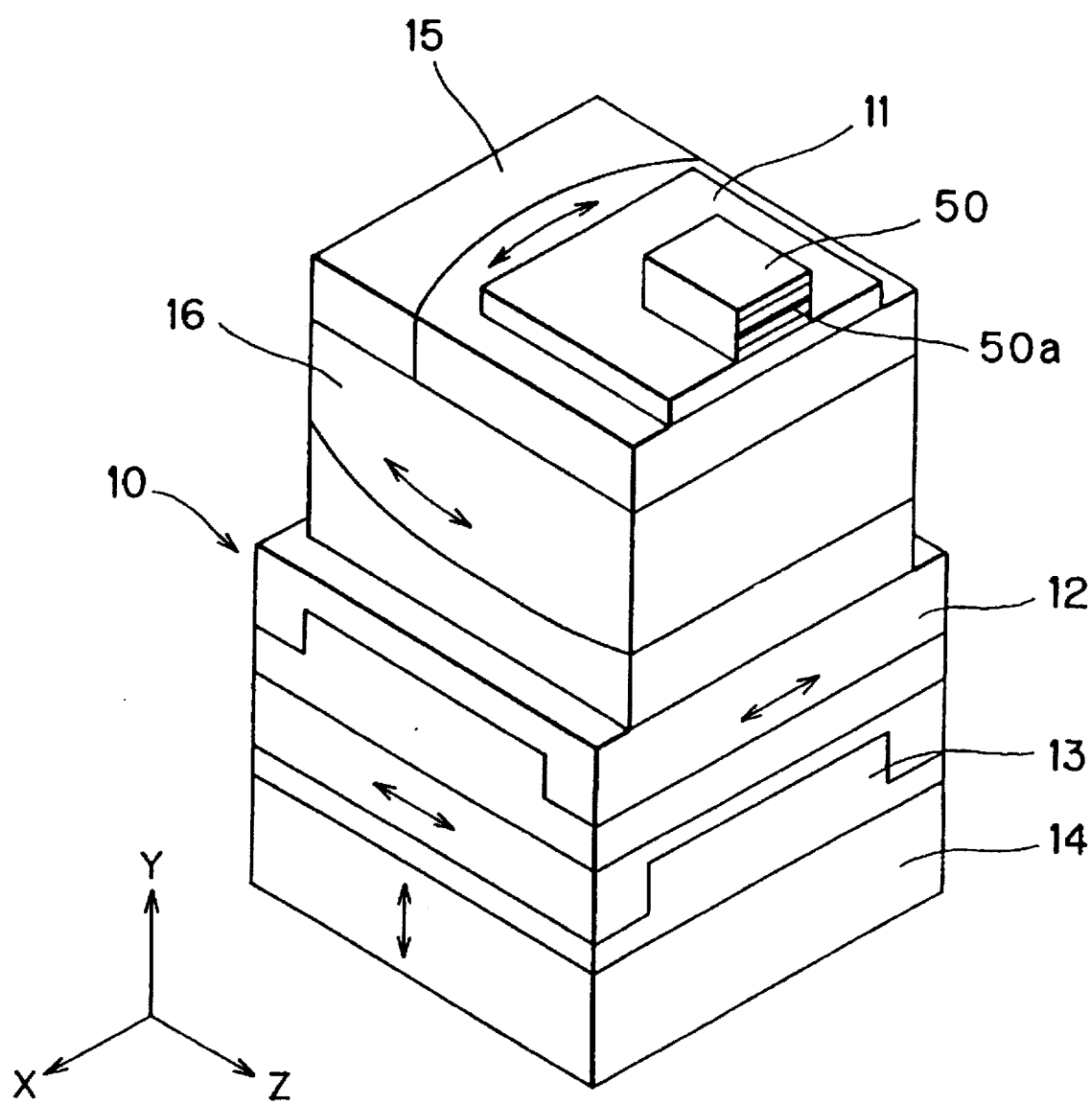
FIG. 3 is a perspective view showing overall configuration of a multi-axes stage device employed in the device of FIG. 2.

As shown in FIG. 3, the multi-axes stage device 10 includes a light source mounting portion 11 for supporting the light source 50 and a plurality of stages 12 through 16. The position of the light source 50 can be adjusted by moving the light source mounting portion 11 through driving the plurality of stages 12–16. The stage drive device 20 is electrically connected to the multi-axes stage device 10 by wiring. The stage drive device 20 is for controlling the plurality of stages 12–16 by transmitting stage control signals to the multi-axes stage device 10.

The measurement optical system 30 is for detecting light emitted from the light source 50 and to measure 1) a shift amount, that is, an amount of displacement between a light-generating point 50a of the light source 50 and a predetermined standard position and 2) a shift angle, that is, an angular shift amount between the direction, in which the light source 50 emits light, and a predetermined standard direction.

The control portion 40 is for transmitting, as a feedback signal, data measured at the measurement optical system 30 to the stage drive device 20. In this way, the control portion 40 drives the multi-axes stage device 10 in the manner of a feed-back mechanism.

The display device 60 is connected to the control portion 40. The output data from the control portion 40 is displayed on the screen of the display device 60.

As shown in FIG. 3, the multi-axes stage device 10 includes an X-axis stage 12, a Z-axis stage 13, and a Y-axis stage 14, all for producing a parallel movement; and a $\Theta_x$-axis stage 15 and a $\Theta_y$-axis stage 16, both for producing an angular movement. The X-axis stage 12, the Z-axis stage 13, and the Y-axis stage 14 move the light source mounting portion 11 along the X-axis direction, Z-axis direction, and Y-axis directions, respectively. The $\Theta_x$-axis stage 15 and the $\Theta_y$-axis stage 16 rotate the light source mounting portion 11 along the X-Z plane and the Y-Z plane, respectively.

The Y-axis stage 14 is disposed at the lower-most level of the multi-axes stage device 10. On top of the Y-axis stage 14 are disposed in order the Z-axis stage 13, the X-axis stage 12, the $\Theta_y$-axis stage 16, and the $\Theta_x$-axis stage 15. The light source mounting portion 11 is disposed on the upper surface of the $\Theta_x$-axis stage 15. The light source 50 is mounted on the light source mounting portion 11.

The X-axis stage 12, the Z-axis stage 13, and the Y-axis stage 14 can locate the light source 50 at any desired position defined by X, Y, and Z coordinate values. The $\Theta_y$-axis stage 16 and the $\Theta_x$-axis stage 15 can orientate the light source 50 at any desired direction defined by the $\Theta_y$ and $\Theta_x$ coordinate values.

In this example, the position of the light source 50 is adjusted so that a light-generating point 50a of the light source 50 will be positioned on a predetermined standard position defined by X=Y=Z=0 and so that the light-generating point 50a will emit light in a predetermined direction defined by $\Theta_y=\Theta_x=0$, i.e., along the Z axis.

The measurement optical system 30 includes: an objective lens 31; a half mirror 32; a positional shift measurement portion 150 for measuring the shift amount between the light-generating point 50a of the light source 50 and the predetermined standard position; and an angular shift measurement portion 160 for measuring the angular shift amount between the direction, in which the light source 50 emits light, and the predetermined standard direction. The positional shift measurement portion 150 includes a positional shift measurement pick-up element 33. The positional shift measurement pick-up element 33 is for measuring a displacement amount of the light-generating point 50a from the predetermined standard position. The angular shift amount measurement portion 160 includes a field lens 34, a relay lens 35, and an angular shift measurement pick-up element 36. The components 34, 35, and 36 are for cooperating to measure an angle by which the direction, in which the light source 50 emits light, is shifted from the predetermined standard direction.

The objective lens 31 serves as a magnifying lens for magnifying light emitted from the light source 50. The lens 31 is located relative to the multi-axes stage device 10 so that the optical axis of the lens 31 coincides with the Z axis of the multi-axes stage device 10.

According to the present embodiment, the light source 50 is disposed in the vicinity of a front focal plane of the objective lens 31. With this optical arrangement, the objective lens 31 receives light from the light source 50 and produces a spatial image I1 of the light-generating point 50a on a back focal plane 70 of the objective lens 31. This spatial image I1 is a Far-Field pattern image.

The half mirror 32 is provided for receiving light emitted from the light source 50. The half mirror 32 reflects thereat about a half of the light and guides it along a first optical path P1 toward the angular shift measurement pick-up element 36. The half mirror 32 transmits therethrough a remaining half of the light from the light source 50, and guides it along a second optical path P2 toward the positional shift measurement pick-up element 33.

Each of the pick-up elements 33 and 36 is constructed from a two-dimensional optical detection element for measuring the incidence position at which light falls incident on its light reception surface. For example, a charge-coupled device (CCD) is Used for each of the elements 33 and 36.

The positional shift measurement pick-up element 33 is disposed so that its light reception surface 33a is located on an image plane 90, onto which the objective lens 31 images an image I2 of the light-generating point 50a. The pick-up element 33 therefore picks up the image I2 of the light-generating point 50a. The image I2 is a Near-Field pattern image.

The field lens 34 serves as a lens for projecting the aperture of the objective lens 31 on the aperture of the relay lens 35. The relay lens 35 serves as a lens system for transferring the spatial image I1 formed on the back focal plane 70 onto a light reception surface 36a of the angular shift measurement pick-up element 36. The relay lens 35 magnifies the spatial image I1 into a sufficiently large size when re-imaging the image I1 onto the light reception surface 36a.

In the present embodiment, a ⅔ inch CCD camera, for example, C5948 or C5940 produced by Hamamatsu Photonics K.K., is used as each of the pick-up elements 33 and 36. A lens having a focal length of 3.49 mm, a numerical aperture of 0.7, and a magnification power of 60 is used as the objective lens 31. Also, an image processor for processing 640×484 pixels is used as the control portion 40. In this case, the pick-up element 33 will pick up an area of 140×105 μm with a pixel resolution of 0.22 μm. The pick-up element 36 will pick up an image in a field view angle of ±45° at maximum with a resolution of 0.2°. By adjusting the relay lens 35 so that the pick-up element 36 can pick up an image in a field view angle of ±15°, then the resolution will be enhanced to 0.06°.

With the above-described optical arrangement, light emitted from the light source 50 falls incident on the objective lens 31. As shown in FIG. 2, the light bundle diverged from the light source 50 includes a plurality of parallel light rays. Three parallel light rays 71, 72, and 73 are shown in the drawing. The parallel light ray 73 is emitted from the light source 50 parallel to the optical axis Z of the objective lens 31. Receiving the parallel light ray 73, the objective lens 31 converges the light ray 73 into a point on the back focal plane 70 on the optical axis Z. The other light ray 71 is emitted from the light source 50 at a certain angle. Receiving the light ray 71, the objective lens 31 converges the light ray 71 into another point on the back focal plane 70. This converged point is shifted from the optical axis Z by a distance corresponding to the angle with which the light ray 71 is emitted from the light source 50. The light ray 72 is emitted from the light source 50 at another angle. Receiving the light ray 72, the objective lens 31 converges the light ray 72 into still another point on the back focal plane 70. This converged point is shifted from the optical axis Z by a distance corresponding to that angle with which the light ray 72 is emitted from the light source 50. Thus, a spatial image I1 is produced on the back focal plane 70. This spatial image I1 has a two-dimensional intensity distribution in proportion to the intensity of the light bundle in the emission direction. In this way, the back focal plane 70 of the objective lens 31 is formed with an intensity distribution image (i.e., an emission angle intensity distribution image) I1 indicating the two-dimensional emission angle characteristic of the light source 50.

It is noted that when the light source 50 is constructed from a semiconductor laser or an optical fiber emission end, the image I1 has the intensity distribution corresponding to a light emission pattern, in a parallel transverse mode, of the light source which is inherent in the configuration of the light source. This image I1 is therefore normally called a Far-Field pattern.

A half of the light bundle then reflects off the half mirror 32 and passes through the field lens 34 and the relay lens 35. As a result, the image I1 produced on the back focal plane 70 is re-imaged into a sufficiently large size on the light-reception surface 36a of the pick-up element 36. That is, the field lens 34 and the relay lens 35 cooperate to re-image the emission angle intensity distribution of the light source 50 onto the light-reception surface 36a.

As described above, parallel light rays emitted from the light source 50 at certain angles with regards to the optical axis Z are converged at the back focal plane 70 into positions which are shifted from the optical axis Z by distances corresponding to the emission angles. Further, the spatial intensity distribution of a light bundle emitted from a light source is normally in a Gaussian distribution. The light-emission direction of the light source 50 can therefore be calculated by determining the peak (the center of gravity) or the most intense point of the spacial distribution of the optical bundle detected by the pick-up element 36.

The remaining half of the optical bundle emitted from the light source 50 passes through the half mirror 32, and proceeds toward the positional shift measurement pick-up element 33. The light-reception surface 33a of the pick-up element 33 is located on the image plane 90 onto which the objective lens 31 forms an image I2 of the light-generating point 50a. This image I2 is a magnification image of the light-generating point 50a which is magnified by the objective lens 31 by 10 to 100 times. Thus, the pick-up element 33 receives the magnification image I2 of the light-generating point 50a. The position of the light-generating point 50a can therefore be calculated by determining the peak (the center of gravity) or the most intense point of the spacial distribution of the optical bundle detected by the pick-up element 33.

With the above-described structure, the light source positional adjustment device adjusts the position of the light source 50 in a manner described below.

Figure 4:
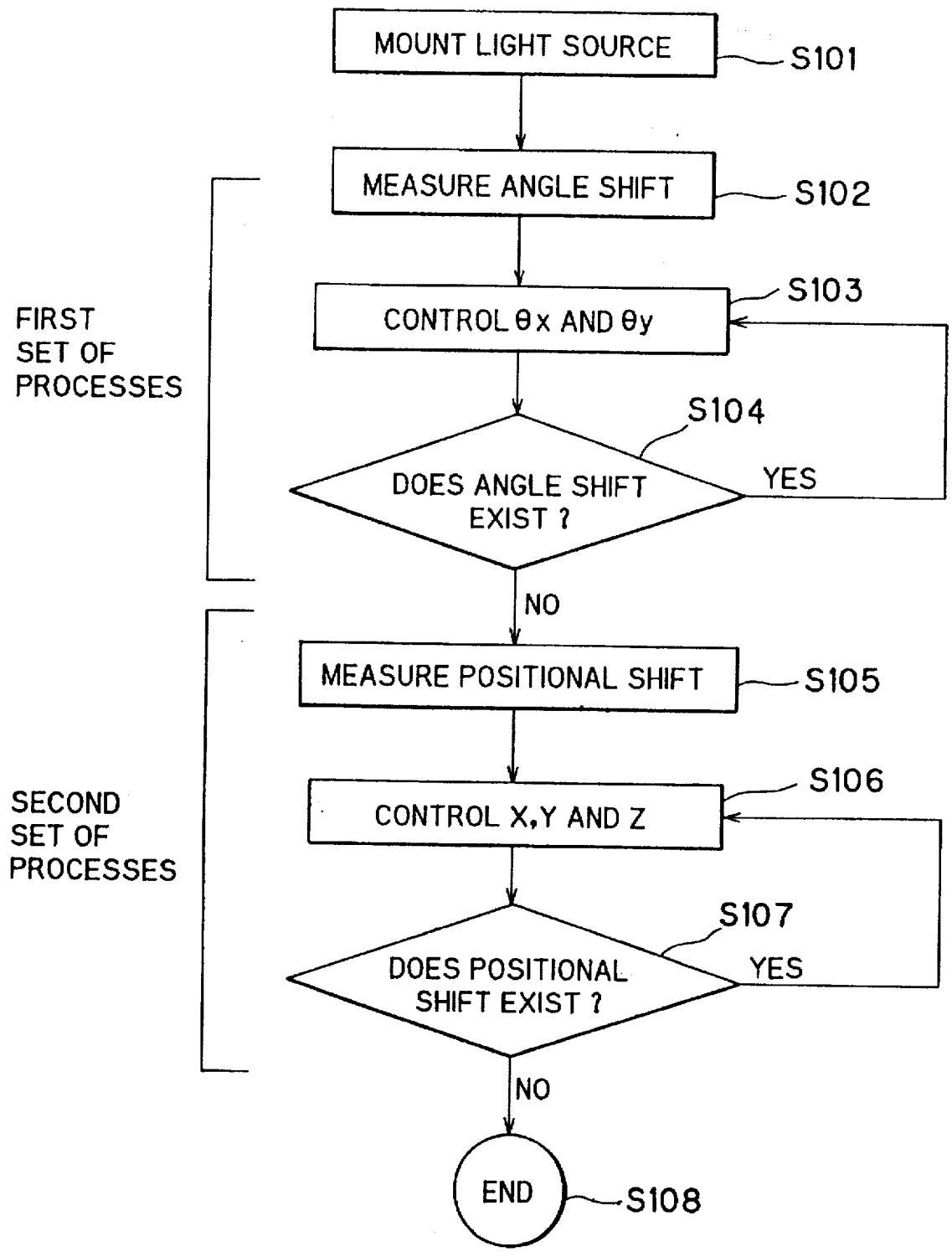
FIG. 4 is a flowchart representing operations of the light source positional adjustment device according to the first embodiment.
Figure 6:
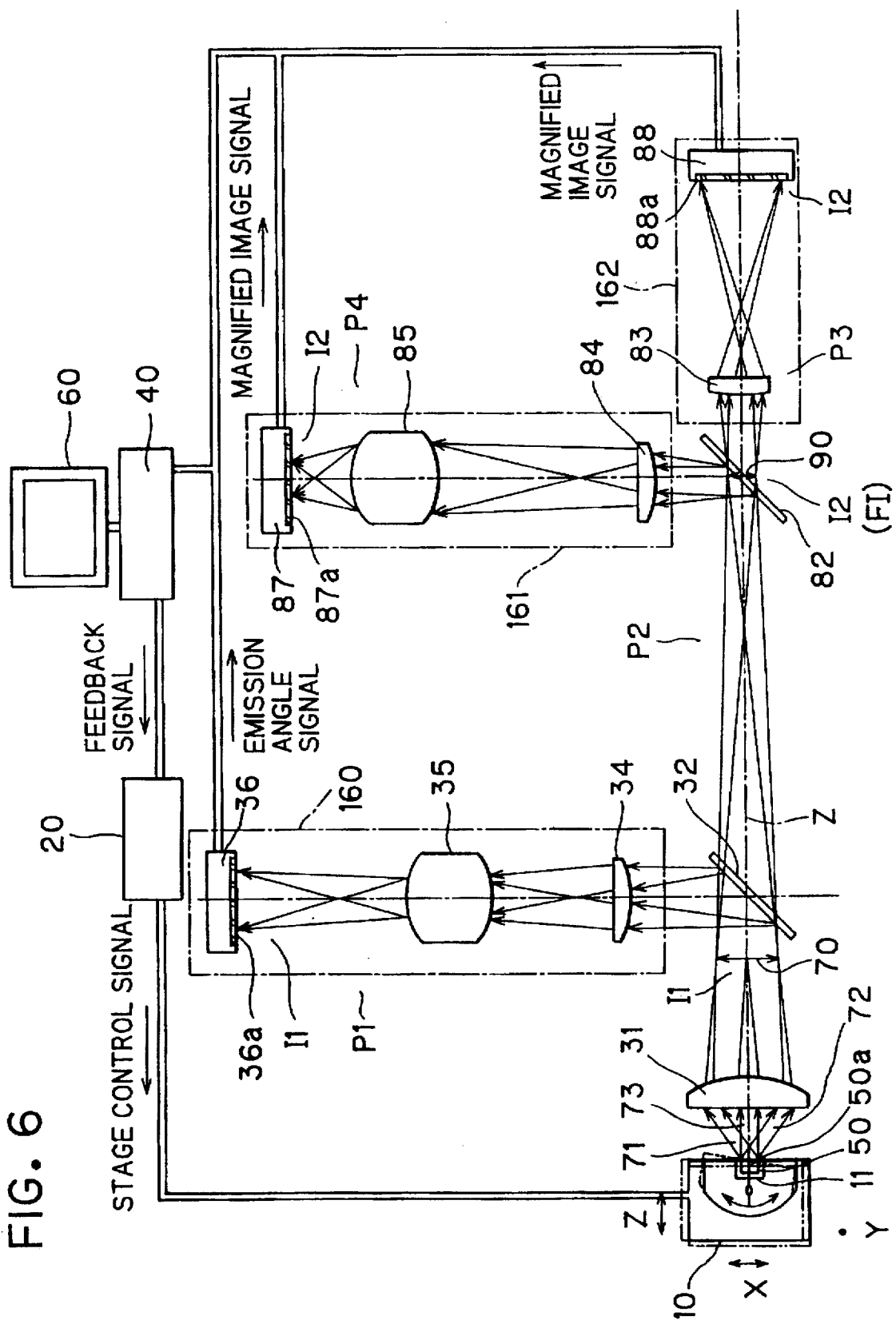
FIG. 6 is a schematic view showing configuration of a light source positional adjustment device according to a second embodiment.

As shown in FIG. 4, the light source 50 is first mounted on the light source mounting portion 11 in S101. Then, the light source 50 is controlled to emit light.

During a first set of processes S102 to S104, the axial angular shift between the light-emission direction of the light source 50 and the standard direction (Z-axis) is measured based on the optical bundle split toward the angular shift measurement pick-up element 36. The angular position (i.e., a setting angle) of the light source 50 is adjusted based on the measured results.

Details of these processes S102–S104 will be described below.

In S102, the control portion 40 controls the pick-up element 36 to supply the control portion 40 with signals (referred to as "emission angle signals") indicative of the detected intensity distribution of the emission angle image I1. Based on the supplied emission angle signals, the control portion 40 controls the display device 60 to two-dimensionally display the emission angle intensity distribution image I1 on a screen. The screen displays the emission angle image I1 in an X and Y coordinate system. The X and Y coordinate values indicated on the screen are equivalent to the $\Theta_x$ and $\Theta_y$ coordinate values of the $\Theta_x$ and $\Theta_y$ stages 15 and 16. The X and Y coordinate values of the image I1 therefore indicate the light-ray emission direction in terms of open angles defined along the X-Z and Y-Z planes.

The control portion 40 then calculates the light-emission direction in terms of open angles defined along both the X-Z and Y-Z planes. That is, the control portion 40 calculates the X and Y coordinate values of the peak (center of gravity) or the most intense point of the image I1 displayed on the display device 60. The control portion 40 defines the light-emission direction by $\Theta_x$ and $\Theta_y$ coordinate values corresponding to the calculated X and Y coordinate values. The control portion 40 then calculates a shift angle amount with which the light-emission direction is shifted from the predetermined standard direction. In this example, because the standard direction is indicated by $\Theta_x=\Theta_x=0$, the shift angle amount is defined by the measured $\Theta_x$ and $\Theta_y$ coordinate values.

Then in S103 and S104, the control portion 40 feedback controls the multi-axes stage device 10 based on the calculated results.

That is, the control portion 40 transmits to the stage drive device 20 a control signal (feedback signal) indicative of the light emission shift angles $\Theta_x$ and $\Theta_y$. Based on the control signal, the stage drive device 20 drives the $\Theta_x$-axis stage 15 and the $\Theta_y$-axis stage 16 so that the light-emission direction will be aligned with the predetermined standard optical axis. In other words, the stage drive device 20 controls the stages 15 and 16 so that the $\Theta_x$ and $\Theta_y$ coordinate values of the light-emission direction will become equal to the $\Theta_x$ and $\Theta_y$ coordinate values of the predetermined standard direction. In this example, the stage drive device 20 controls the stages 15 and 16 so that $\Theta_x$ and $\Theta_y$ coordinate values of the light-emission direction will become zero values.

Afterward in S104, the control portion 40 again performs a measurement of the light emission angles $\Theta_x$ and $\Theta_y$ of the light source 50 in the same manner as in S102, and determines whether there still remains any angular shift of the light-emission direction with respect to the standard direction. When an angular shift is found, the control portion 40 again controls drive of the multi-axes stage device 10 so that $\Theta_x$ and $\Theta_y$ coordinate values of the light-emission direction become equal to the $\Theta_x$ and $\Theta_y$ coordinate values of the standard direction.

The above-described operations are repeated until the light-emission direction of the light source 50 is properly adjusted into alignment with the predetermined standard direction with extremely high accuracy. This completes the first set of processes.

FIGS. 5(a) and 5(b) show the situation how the light-emission direction is adjusted to coincide with the Z axis (standard direction). The adjustment is performed so that both the $\Theta_x$ and $\Theta_y$ coordinate values become zero values.

When the emission angle intensity distribution image I1 is originally shifted in the X axis as shown in the left side of FIG. 5(a), the control portion 40 feedback controls the multi-axes stage device 10 so that the $\Theta_x$-axis stage 15 is driven to rotate the light source 50 along the X-Z plane. As a result, as shown in the right side of FIG. 5(a), the $\Theta_x$ and $\Theta_y$ coordinate values of the light emission direction become zero values.

When the emission angle intensity distribution image I1 is originally shifted in the Y axis as shown in the left side of FIG. 5(b), on the other hand, the control portion 40 feedback controls the multi-axes stage device 10 so that the $\Theta_y$-axis stage 16 is driven to rotate the light source 50 along the Y-Z plane. As a result, as shown in the right side of FIG. 5(b), the $\Theta_x$ and $\Theta_y$ coordinate values of the light emission direction become zero values.

Next, an explanation will be provided for a second set of processes S105 through 107 according to the present embodiment.

In the second set of processes, the pick-up element 33 measures the amount that the light-generating point 50a is displaced from the predetermined standard position (X=Y=Z=0, in this example). Based on the measured results, the position of the light source 50, with its emission direction being already adjusted in the first set of processes, is adjusted so that the light-generating point 50a will coincide with the standard position.

The second set of processes will be described in greater detail below.

In S105, the control portion 40 controls the positional shift measurement pick-up element 33 to pick up the magnification image I2 of the light-generating point 50a and to supply the control portion 40 with a magnification image signal representing the magnification image I2.

Based on the supplied magnification image signal, the control portion 40 controls the display device 60 to display the magnification image I2 in the X-Y coordinate system of the screen. The X and Y values on the screen are equivalent with the coordinates of the X-axis stage 12 and the Y-axis stage 14.

The control portion 40 then calculates a position of the light-generating point 50a in the X and Y axial directions. This position is defined by the X and Y coordinate values of the peak (center of gravity) or the most intense point of the image I2 displayed on the display device 60. The control portion 40 then calculates the amount by which the light-generating point is shifted from the standard position in both the X and Y axial directions. In this example, because the standard position is indicated by X=0 and Y=0, the shift amount is defined by the measured X and Y coordinate values.

It is noted that the control portion 40 also calculates intensity of the most intense point in the magnification image I2.

Then, in S106 and S107, the control portion 40 feedback controls the X-axis, Y-axis, and Z-axis stages 12, 14, and 13 in the following manner.

First, the control portion 40 feedback controls only the Z-axis stage 13 so that the intensity of the most intense point of the magnification image I2 be maximized and therefore so that the magnification image I2 is brought into focus on the pick-up element 33. It is noted that when the magnification image I2 is thus brought into focus on the pick-up element 33, the size of the image I2 is minimized.

This Z-axis feedback operation will be described below.

In S106, the control portion 40 supplies a control signal (i.e. a feedback signal) to the stage drive device 20. The control signal is for driving the stage drive device 20 to drive the Z-axis stage 13 by a small amount in one of opposite directions along the Z axis.

Then, in S107, the control portion 40 again performs a measurement of the position of the light-generating point 50a in the same manner as in S105, and calculates the intensity of the most intense point in the magnification image I2. Then, the control portion compares the presently-measured intensity with the last-measured intensity. When the presently-measured intensity is higher than the last-measured intensity, the control portion again drives the Z-axis stage 13 in S106 by another small amount again in the same direction. Then, a measurement is again performed in S107 to calculate the intensity of the most intense point. On the other hand, when the presently-measured intensity is lower than the last-measured intensity, the control portion drives the Z-axis stage 13 in S106 by another small amount in an opposite direction. Then, a measurement is again performed in S107 to calculate the intensity of the most intense point.

The above-described feedback operations S106 and S107 are repeated until the intensity of the most intense point in the magnification image I2 is maximized. Thus, the magnification image I2 is brought into focus onto the pick-up element 33, and the positional shift of the light-generating point 50a is eliminated in the Z-axis direction. In this example, the light-generating point 50a is properly positioned on the position of Z=0.

The control portion 40 then feedback controls the X-axis and Y-axis stages 12 and 14 so as to eliminate positional shifts in the X and Y axial directions.

These X-axis and Y-axis feedback operations will be described below.

In S106, the control portion 40 supplies a control signal (i.e. a feedback signal) to the stage drive device 20. The control signal represents the measured X and Y coordinate values of the light-generating point 50a. The stage drive device 20 drives the X-axis and Y-axis stages 12 and 14 so that the light-generating point 50a will be properly placed on the predetermined standard position. In other words, the stage drive device 20 controls the stages 12 and 14 so that the X and Y coordinate values of the light-generating point 50a will become equal to the X and Y coordinate values of the predetermined standard position. In this example, the stage drive device 20 controls the stages 12 and 14 so that the X and Y coordinate values of the light-generating point 50a will become zero values.

Afterward in S107, the control portion 40 again performs a measurement of the position of the light-generating point 50a in the same manner as in S105, and determines whether here still remains any shift of the light-generating position with respect to the standard position. When a positional shift is found, the control portion 40 again controls drive of the multi-axes stage device 10 so that the X and Y coordinate values of the light-generating position will become equal to the X and Y coordinate values of the standard position.

The above-described operations are repeated until the light-generating point 50a is properly located at the predetermined position with extremely high accuracy. This completes the second set of processes.

FIGS. 5(c) through 5(e) show the situation how the light-emission point 50a is adjusted to be located on the standard position defined by X=Y=Z=0. The adjustment is performed so that all the X, Y, and Z coordinate values of the image I2 become zero values.

When the image I2 is originally shifted in the Z axis and therefore is out of focus as shown in the left side of FIG. 5(c). The control portion 40 feedback controls the multi-axes stage device 10 so that the Z-axis stage 13 is driven to move the light source 50 in the Z axis direction. As a result, as shown in the right side of FIG. 5(c), the X, Y, and Z coordinate values of the image I2 become zero values when the intensity of the most intense point in the image I2 is maximized, that is, when the size of the image I2 is minimized.

When the image I2 is originally shifted in the X axis as shown in the left side of FIG. 5(d), the control portion 40 feedback controls the multi-axes stage device 10 so that the X-axis stage 12 is driven to move the light source 50 in the X axis direction. As a result, as shown in the right side of FIG. 5(d), the X, Y, and Z coordinate values of the image I2 become zero values.

When the image I2 is originally shifted in the Y axis as shown in the left side of FIG. 5(e), the control portion 40 feedback controls the multi-axes stage device 10 so that the Y-axis stage 14 is driven to move the light source 50 in the Y axis direction. As a result, as shown in the right side of FIG. 5(e), the X, Y, and Z coordinate values of the image I2 become zero values.

Thus, measurements of the light-emission direction angular shift and of the light-generating point positional shift are performed in real time. Because no information on the light-generating point position is included in the measurement data of the emission angle intensity distribution I1, there is no need to accurately align the position of the light source 50 before measurements are taken for the light-emission direction angular shift. Therefore, measurements require fewer processes so that adjustment of the light source can be performed rapidly.

Because drive of the multi-axes stage device 10 is repeatedly feedback controlled according to measurements of the light-generating point position and of the light emission direction, the light-generating point position and the light-emission direction can be properly aligned with the predetermined position and the predetermined direction.

For this reason, the device of the present invention allows positioning of the light-generating point and the light-emission direction with high-precision. Because the light source can be mounted to the housing with good precision, as a result, a light emitting device, such as a semiconductor laser device, a super luminescent diode (SLD) device (i.e., an infrared light emission device), an LED device, an optical wave guide device, and an optical fiber device, can be provided with an only slight variation in its beam-generating position and in its beam-emission direction. By adjusting the position of the light source using the device of the present embodiment, the light source and the optical element, such as an optical fiber, an optical wave guide, and the like, can be easily and effectively connected together.

As described above, in the present embodiment, the magnification lens 31 magnifies a light bundle emitted from the light source 50. The half mirror 32 guides the light bundle outputted from the magnification lens 31 toward the first and second optical paths P1 and P2. The angular shift measuring portion 36 is disposed in the first optical path P1 for detecting emission angle intensity distribution of the light source 50. The position shift measuring portion 33 is disposed in the second optical path P2 for detecting a magnification image of the light source 50 which is produced on the image plane 90 of the magnification lens 31. The light source 50 is disposed on the multi-axes stage unit 10 which is driven by the stage drive unit 20. The control portion 40 receives output signals from the angular shift measuring portion 36 and the position shift measuring portion 33, and determines an amount by which the light-emission direction shifts from the predetermined standard direction and an amount by which a light-generating point 50a is displaced from the standard position. The control portion 40 outputs control signals to the stage drive unit. Receiving the control signals, the stage drive unit 20 drives the multi-axes stage unit 10 so that the light-emission direction be aligned with the standard direction and so that the light-generating point be located on the standard position.

Next, a light source positional adjustment device according to a second preferred embodiment will be described below with reference to FIGS. 6 through 9.

The device of the present embodiment includes the multi-axes stage device 10, the stage drive device 20, the objective lens 31, the half mirror 32, another half mirror 82, the angular shift measurement portion 160, a wide-range positional shift measurement portion 161, a narrow-range positional shift measurement portion 162, the control portion 40, and the display device 60. The components 10, 20, 31, 32, 160, 40, and 60 are the same as those employed in the first embodiment. The angular shift measurement portion 160 therefore includes the field lens 34, the relay lens 35, and the angular shift measurement pick-up element 36 which are arranged on the first optical path P1 in the same manner as in the first embodiment.

The wide-range positional shift measurement portion 161 includes a field lens 84, a relay lens 85, and a wide-range positional shift measurement pick-up element 87. The narrow-range positional shift measurement portion 162 includes an imaging lens 83 and a narrow-range positional measurement pick-up element 88. Similarly as in the first embodiment, the angular shift measurement pick-up element 36, the wide-range positional shift measurement pick-up element 87, and the narrow-range positional measurement pick-up element 88 serve as two-dimensional optical detection elements for detecting two-dimensional intensity distribution of light bundles incident on their respective reception surfaces. Each of the pick-up elements is constructed from a CCD, for example.

Similarly as in the first embodiment, the objective lens 31 magnifies light emitted from the light source 50. When receiving light emitted from the light source 50, the objective lens 31 produces, on the back focal plane 70, an emission angle distribution intensity image I1 of the light-generating point 50a. The half mirror 32 reflects about a half of the light incident thereon and guides the light along the first optical path P1 toward the angular shift measurement pick-up element 36. The half mirror 32 transmits a remaining half and guides the light along the second optical path P2 toward the half mirror 82. In the angular shift measurement portion 160, the field lens 34 projects the aperture of the objective lens 31 on the aperture of the relay lens 35. The relay lens 35 re-images the spatial image I1 on the reception surface 36a of the angular shift measurement pick-up element 36 while magnifying the image I1 into a sufficiently large size.

According to the present embodiment, the half mirror 82 is disposed on the image plane 90, onto which the objective lens 31 images a spatial magnification image I2 of the light-generating point 50a. The half mirror 82 is oriented so that the normal of the mirror surface is slanted at an angle of 45° to the optical axis (axis Z in this example) of the optical system comprising the objective lens 31 and the imaging lens 83. With this posture, the half mirror 82 transmits a half of the incident light to guide the light along a third optical path P3 in the narrow-range positional shift measurement portion 162. The half mirror 82 reflects a remaining half to guide the light along a fourth optical path P4 in the wide-range positional shift measurement portion 161. Because the half mirror 82 is positioned in the above-described manner, the magnification image I2 of the light-generating point 50a is formed in the same position on the pick-up field of the pick-up element 87 and on the pick-up field of the pick-up element 88. Accordingly, when the magnification image I2 is positioned in the center of the pick-up field of the pick-up element 87, then the image I2 will also be positioned in the pick-up field of the pick-up element 88.

Actually, the objective lens 31 is designed to transmit therethrough a predetermined field of view (or field) while magnifying an image of the field of view. Accordingly, the objective lens 31 can produce, on the image plane 90, not only the image I2 of the light-generating point 50a but also an image I2' of a background area which is located within the field of the objective lens 31 but which surrounds the light-generating point 50a. Therefore, an image FI (not shown) of the entire field of the objective lens 31 is formed on the image plane 90. (This image FI will be referred to as a "field image," hereinafter.) The field image FI is constructed from the magnification image I2 of the light-generating point 50a and the magnification image I2' of the background area surrounding the light-generating point 50a. The light-generating point image I2 is located on the center of the field image FI, and the surrounding area image I2' is located around the light-generating point image I2.

Figure 8:
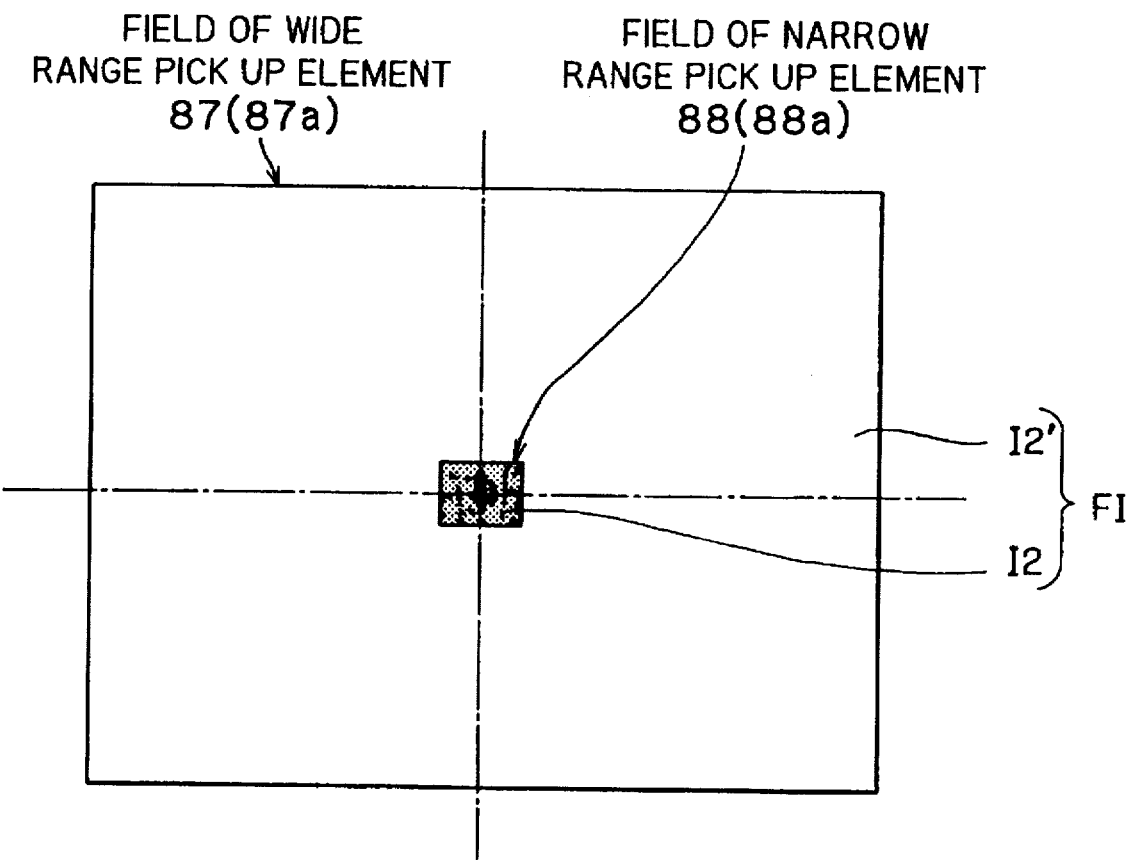
FIG. 8 illustrates a relationship between a pick-up field of a wide-range pick-up element 87 and a pick-up field of a narrow-range pick-up element 88.

The field lens 84 disposed on the optical path P4 serves as a lens system for projecting the aperture of the objective lens 31 on the aperture of the relay lens 85. The relay lens 85 serves as a lens system for re-imaging the field image FI on a reception surface 87a of the pick-up element 87 while reducing the size of the field image FI. Accordingly, as shown in FIG. 8, the field image FI is entirely received on the reception surface 87a. Both the light-generating point image I2 and the surrounding area image I2' are re-imaged onto the reception surface 87a. In other words, the field of view of the pick-up element 87 is determined by the lenses 84 and 85 so as to be capable of entirely picking up the image FI of the entire field of the objective lens 31.

The imaging lens 83 is disposed on the optical path P3 at the rear side of the half mirror 82. The imaging lens 83 is for magnifying the field image FI, which is already magnified by the objective lens 31, further to a size excessively large for a reception surface 88a of the pick-up element 88. The imaging lens 83 has a magnification power of 5 to 20 power, for example. In this example, the imaging lens 83 magnifies the already-magnified field image FI by about ten times. As a result, the size of the surrounding area image I2' will be larger than the pick up field of the pick-up element 88 and therefore will not be picked up by the pick-up element 88. Only the light-generating point image I2 will be imaged on the reception surface 88a. In other words, as shown in FIG. 8, a field of view of the pick-up element 88 is determined by the imaging lens 83 so as to be capable of picking up only the image I2 of the light-generating point 50a, that is, only the central part of the image FI of the entire field of the objective lens 31.

The control portion 40 is for calculating the light-generating point positional shift and the light-emission direction angular shift based on pick-up information signals transmitted from the pick-up elements 36, 87, and 88. The control portion 40 is also for transmitting the calculated data to the stage drive device 20 as a feedback signal to control drive of the multi-axes stage device 10. The control portion 41 is further for controlling the display device 60 to display the situation of the light-generating point positional shift and the light-emission direction angular shift of the light source 50.

Also in the present embodiment, a ⅔ inch CCD camera, for example, C5948 or C5940 produced by Hamamatsu Photonics K.K., is used as each of the pick-up elements 36, 87, and 88. A lens having a focal length of 3.49 mm, a numerical aperture of 0.7, and a magnification power of 60 is used as the objective lens 31. Also, an image processor for processing 640×484 pixels is used as the control portion 40. In this case, the pick-up element 87 will pick up an area of 140×105 μm with a pixel resolution of 0.22 μm. The pick-up element 88 will pick up an area of 14×10 μm with a pixel resolution of 0.02 μm. The pick-up element 36 will pick up an image in a field view angle of ±45° at maximum with a resolution of 0.2°. By adjusting the relay lens 35 so that the pick-up element 36 can pick up an image in a field view angle of ±15°, then the resolution will be enhanced to 0.06°.

With the above-described optical arrangement, the light emitted from the light source 50 is magnified at the objective lens 31 and then divided by the half mirror 32 into two light bundles. The portion of the light bundle reflected from the half mirror 32 passes through the field lens 34 and the relay lens 35. As a result, the spatial image I1 formed on the back focal plane 70 is imaged on the reception surface 36a of the angular shift measurement pick-up element 36 at a sufficiently large size. That is, the field lens 34 and the relay lens 35 cooperate to re-image the spatial image I1 of the light-generating point 50a on the reception surface 36a of the pick-up element 36.

As described already in the first embodiment, the spatial image I1 is an emission angle intensity distribution which indicates the two-dimensional emission angle characteristic of the light source 50. The components 34 and 35 cooperate to re-image the two-dimensional emission angle characteristic of the light source 50 on the reception surface 36a of the angular shift measurement pick-up element 36. In the same manner as in the first embodiment, by determining the most intense point or the position of the peak (center of gravity) in the spatial intensity distribution detected by the pick-up element 36, the light emission direction of the light source 50 can be calculated.

The remaining half of the optical bundle emitted from the light source 50 passes through the half mirror 32, and is imaged into the magnification spatial image I2 on the image plane 90. The image plane 90 is also formed with the magnification image I2' of the background area which is located within the field of the objective lens 31 and which surrounds the light source 50. In other words, the image plane 90 is formed with the field image FI originated from the entire field of the objective lens 31. The field image FI is therefore a magnification image of the entire field of the objective lens 31. While forming this spatial image FI, the optical bundle falls incident on the half mirror 82.

The half mirror 82 reflects a half of the incident optical bundle. The field lens 84 and the relay lens 85 transmit therethrough the optical bundle reflected from the half mirror 82. The lenses 84 and 85 cooperate to re-image the field image FI while reducing the image FI into another magnification image which has a sufficiently small size and which entirely enters the reception surface 87a of the wide-range positional shift measurement pick-up element 87. Still, this image represents a magnification image of the entire field of the objective lens 31. Accordingly, both the image I2 of the light-generating point 50a and the image I2' of the surrounding area enter the reception surface 87a of the pick-up element 87 as shown in FIG. 8. In other words, the lenses 84 and 85 serve to cause the pick-up element 87 to pick up an entire part of the field image FI which has originated from the entire field of the objective lens 31.

The half mirror 82 transmits therethrough a remaining half of the incident optical bundle. The imaging lens 83 receives the incident light bundle that passes through the half mirror 32. The imaging lens 83 then magnifies the field image FI into a further magnified image. The further magnified image FI has an excessively large size which is beyond the area of the reception surface 88a of the narrow-range positional measurement pick-up element 88. Accordingly, the reception surface 88a can pick up only the image I2 of the light-generating point 50a, that is, a central part of the field image FI of the objective lens 31. In other words, the imaging lens 83 serves to cause the pick-up element 88 to pick up only a central part of the field image FI which has originated from the central part of the field of the objective lens 31.

With the above-described optical arrangement, as shown in FIG. 8, the narrow-range pick-up element 88 picks up, by its entire pick-up field, only the center portion of the pick-up field of the wide-range pick-up element 87. For example, the area of the pick-up field of the element 88 is set as only ⅕th to ¹⁄₂₀th of the area of the pick-up field of the element 87. Accordingly, the narrow-range pick-up element 88 can more accurately measure the position of the light-generating point 50 than does the wide-range element 87. Because the narrow-range positional measurement pick-up element 88 measures the magnification image I2 in a small field of view in the range of about 10 to 20 μm, it is difficult to position the image I2 of the light-generating point 50a within its pick-up field. According to the present embodiment, therefore, this pick up operation is performed only after the positional shift is measured using the wide-range pick-up element 87 and then the position of the light source 50 is adjusted based on the measured result. The image I2 of the light source 50 can therefore be properly located within the pick-up field of the narrow-range pick-up element 88.

Figure 7:
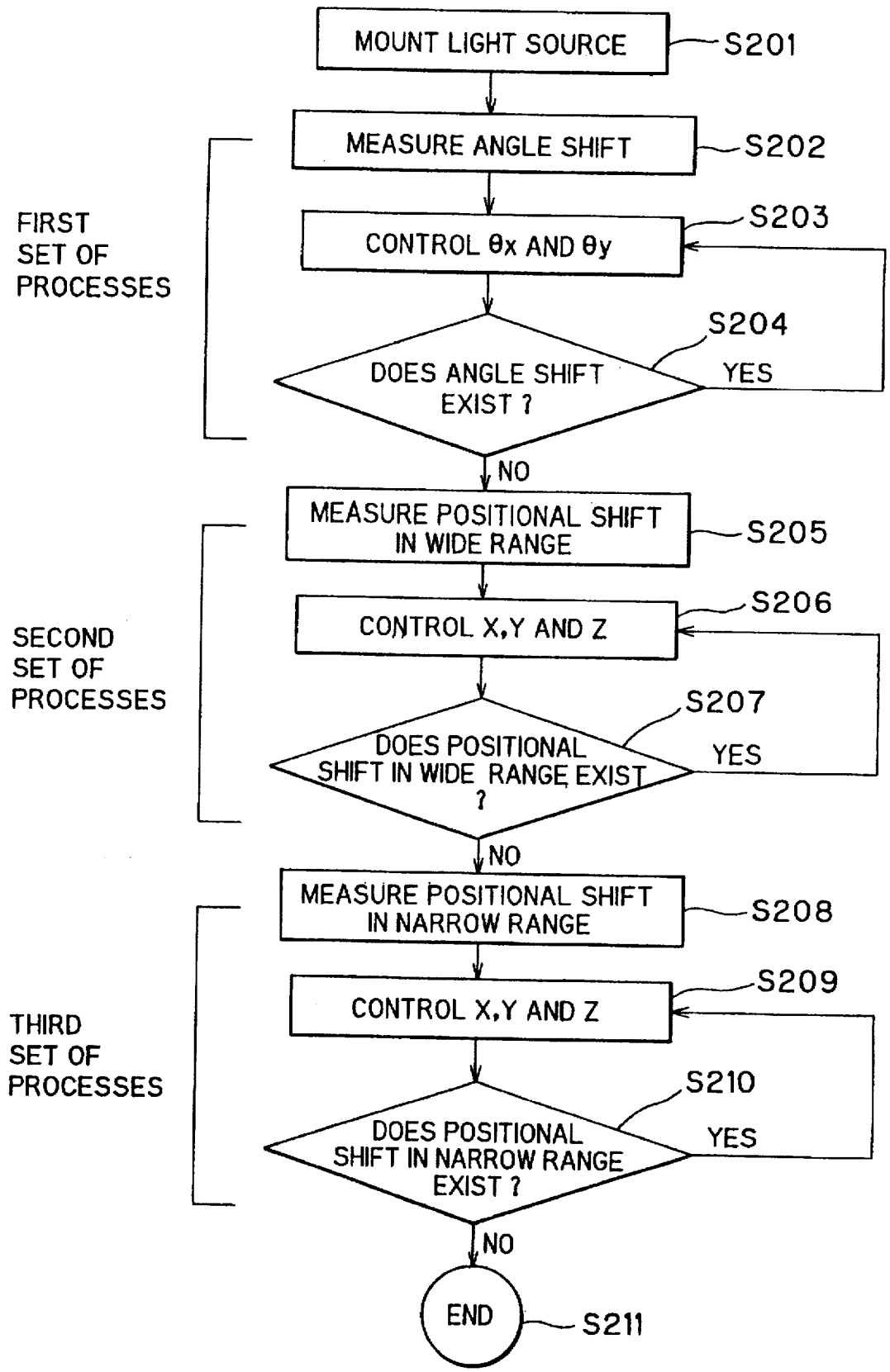
FIG. 7 is a flowchart representing operations of the light source positional adjustment device according to the second embodiment.

Operations of the light source positional adjustment device of the present embodiment will be described below while referring to the flowchart in FIG. 7.

Similarly to the first embodiment, the light source 50 is first mounted on the light source mounting portion 11 in S201. Then, the light source 50 is driven to emit light.

Also similarly to the first embodiment, during a first set of processes S202 to S204, the axial angular shift between the light-emission direction of the light source 50 and the standard direction is measured based on the optical bundle split toward the angular shift measurement pick-up element 36. The angular position of the light source 50 is adjusted based on the measured results.

These processes S202–S204 are similar to the processes S102–S104 of the first embodiment as described below.

In S202, the control portion 40 controls the pick-up element 36 to supply the control portion 40 with emission angle signals indicative of the detected intensity distribution of the emission angle image I1. Based on the supplied emission angle signals, the control portion 40 controls the display device 60 to two-dimensionally display the emission angle intensity distribution image I1 in the X and Y coordinate system. The control portion 40 then calculates the light-emission direction in terms of open angles $\Theta_x$ and $\Theta_y$ defined along the X-Z and Y-Z planes. The control portion 40 then calculates a shift angle amount with which the light-emission direction is shifted from the predetermined standard direction.

Then in S203 and S204, the control portion 40 feedback controls the multi-axes stage device 10 based on the calculated results. That is, the control portion 40 transmits to the stage drive device 20 a control signal (feedback signal) indicative of the light emission shift angles $\Theta_x$ and $\Theta_y$. Based on the control signal, the stage drive device 20 drives the $\Theta_x$-axis stage 15 and the $\Theta_y$-axis stage 16 so that the light-emission direction will be aligned with the predetermined standard optical axis. Afterward in S204, the control portion 40 again performs a measurement of the optical emission angle of the light source 50 in the same manner as in S202, and determines whether there still remains any angular shift of the light-emission direction with respect to the standard direction. When an angular shift is found, the control portion 40 again controls drive of the multi-axes stage device 10.

The above-described operations are repeated until the light-emission direction of the light source 50 is properly adjusted into alignment with the predetermined standard direction with extremely high accuracy. This completes the first set of processes.

Next, an explanation will be provided for a second set of processes S205 through S207 according to the present embodiment.

In this second set of processes, the part of the light bundle passing through the half mirror 32 is measured to determine a positional shift amount of the light-generating point 50a. Based on the measured results, the position of the light source 50, with its emission direction being already adjusted in the first set of processes, is adjusted so that the light-generating point 50a will be located on the standard position.

The second set of processes will be described in greater detail below.

In the second set of processes S205 through S207, the control portion 40 receives, from the wide-range positional shift measurement pick-up element 87, a signal representing the small-degree magnified image I2 of the light source 50. Based on the supplied signal, the control portion 40 measures the shift amount by which the light-generating point 50a is shifted from the standard position, and adjusts the position of the light source 50.

The processes S205 through S207 will be described in greater detail below. Those processes are similar to the processes S105 through S107 as described below.

In S205, the control portion 40 controls the positional shift measurement pick-up element 87 to pick up the small-degree magnified image I2 of the light-generating point 50a and to supply the control portion 40 with a magnification image signal representing the image I2. Based on the supplied magnified image signal, the control portion 40 controls the display device 60 to display the image I2 in the X-Y coordinate system of the screen. The control portion 40 calculates a position of the light-generating point 50a in the X and Y axial directions. The control portion 40 then calculates the amount by which the light-generating point is shifted from the standard position in both the X and Y axial directions. The control portion 40 also calculates intensity of the most intense point in the image I2.

Then, in S206 and S207, the control portion 40 feedback controls the X-axis, Y-axis, and Z-axis stages 12, 14, and 13 in the following manner.

First, the control portion 40 feedback controls only the Z-axis stage 13 so that the intensity of the most intense point in the image I2 be maximized and therefore so that the image I2 is brought into focus on the pick-up element 87. This Z-axis feedback operation is the same as that of the first embodiment. When the image I2 is brought into focus and the positional shift of the light-generating point 50a is eliminated in the Z-axis direction, the control portion 40 feedback controls the X-axis and Y-axis stages 12 and 14 as to eliminate positional shifts in the X and Y axial directions. These X-axis and Y-axis feedback operations are also the same as those employed in the first embodiment. That is, in S206, the control portion 40 supplies a control signal (i.e. a feedback signal) to the stage drive device 20. The control signal represents the measured X- and Y- coordinate values of the light-generating point position. The stage drive device 20 feedback drives the X-axis and Y-axis stages 12 and 14 so that the light-generating point 50a will be properly placed on the predetermined standard position. The feedback operations are repeated until the light-generating point 50a is properly located on the predetermined position with high accuracy. This completes the second set of processes.

According to the present embodiment, a third set of processes S208 through S210 is operated after the second set of processes as described below.

In this set of process, the control portion 40 receives, from the narrow-range positional shift measurement pick-up element 88, a signal representing the large-degree magnified image I2 of the light source 50. Based on the supplied signal, the control portion 40 displays the large-degree magnified image I2 on the screen and calculates in S208 the position of the light-generating point 50a. Based on the calculated results, in S209 and S210, the control portion 40 repeatedly feedback drives the X-axis stage 12, the Z-axis stage 13, and the Y-axis stage 14 in the same manner as in S205–S207 so that the position of the light source 50 is further adjusted.

Because the narrow-range positional shift measurement portion 162 provides detailed positional information on the light-generating point 50a, the position of the light-generating point 50a can be adjusted with higher precision. When this set of processes is end, processes for adjusting the position of the light source 50 are completed in S211.

As described above, after adjusting the position of the light source 50 based on measurements taken by the wide-range positional shift measurement portion 161, minute adjustment is performed based on measurements taken by the narrow-range positional shift measurement portion 162. In this way, the light-generating point position of the light source 50 can be adjusted with a greater precession.

Figure 9:
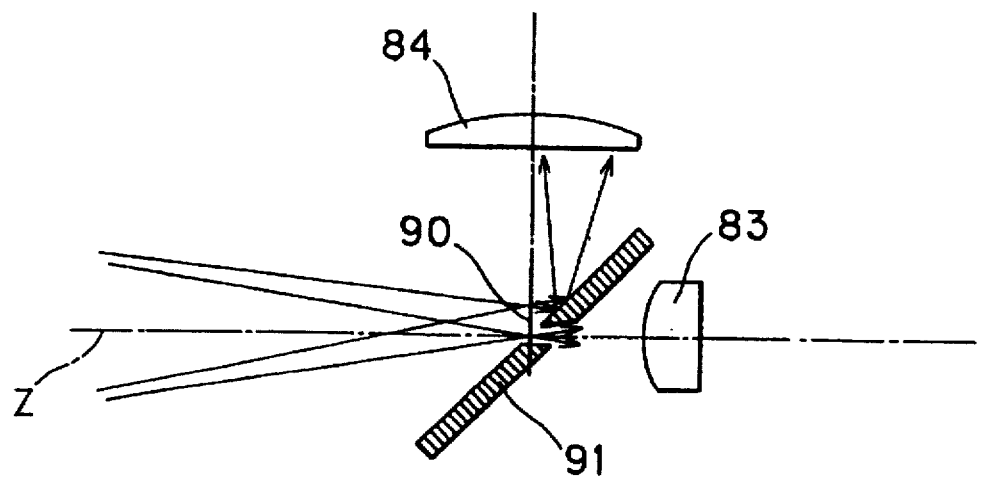
FIG. 9 shows a modification in which a reflective mirror 91 is provided in place of a half mirror 82 in the second embodiment.

In the above description, the half mirror 82 divides the optical bundle from the light source 50 into an optical bundle guided toward the wide-range positional shift measurement portion 161 and an optical bundle guided toward the narrow-range positional shift measurement portion 162. However, as shown in FIG. 9, a reflection mirror 91 may be provided in place of the half mirror 82. This reflection mirror 91 is formed with a hole at its center position so that the hole is located on the optical axis Z. The hole has a diameter of about 14 μm, for example. The position of the light source 50 can be adjusted also in this case because the reflection mirror 91 allows the image I2 of the light source. 50 to be detected both by the wide-range positional shift measurement portion 161 and by the narrow-range positional shift measurement portion 162. The reflection mirror 91 will not reduce the light amount of the optical bundle guided toward the measurement portions 161 and 162. Therefore, the reflective mirror 91 is an effective means to apply when the light source 50 emits a small amount of light.

Next, a light source positional adjustment device according to a third preferred embodiment will be described below with reference to FIGS. 10 and 11.

The device of the present embodiment is the same as that of the first embodiment except that a mirror 202 is provided in place of the half mirror 32. The mirror 202 is attached to a mirror moving mechanism 201. The mirror moving mechanism 201 is capable of moving the mirror 202 between a first position (A) shown in FIG. 10 and a second position (B) shown in FIG. 11. The mirror 202 at the first position (A) is located on the optical path of the light bundle from the objective lens 31. The mirror 202 at the first position (A) can therefore reflect the incident light and guide it to the optical path P1. The mirror 202 at the second position (B) is located away from the optical path from the objective lens 31. Accordingly, the light from the objective lens 31 will travel linearly to proceed along the second optical path P2. The control portion 40 controls the mirror moving mechanism 201 to switch between the first state (A) and the second state (B).

The device of the present embodiment performs the same operations as those shown in FIG. 4 in the first embodiment except for the control of the mirror moving mechanism 201 as described below.

Figure 10:
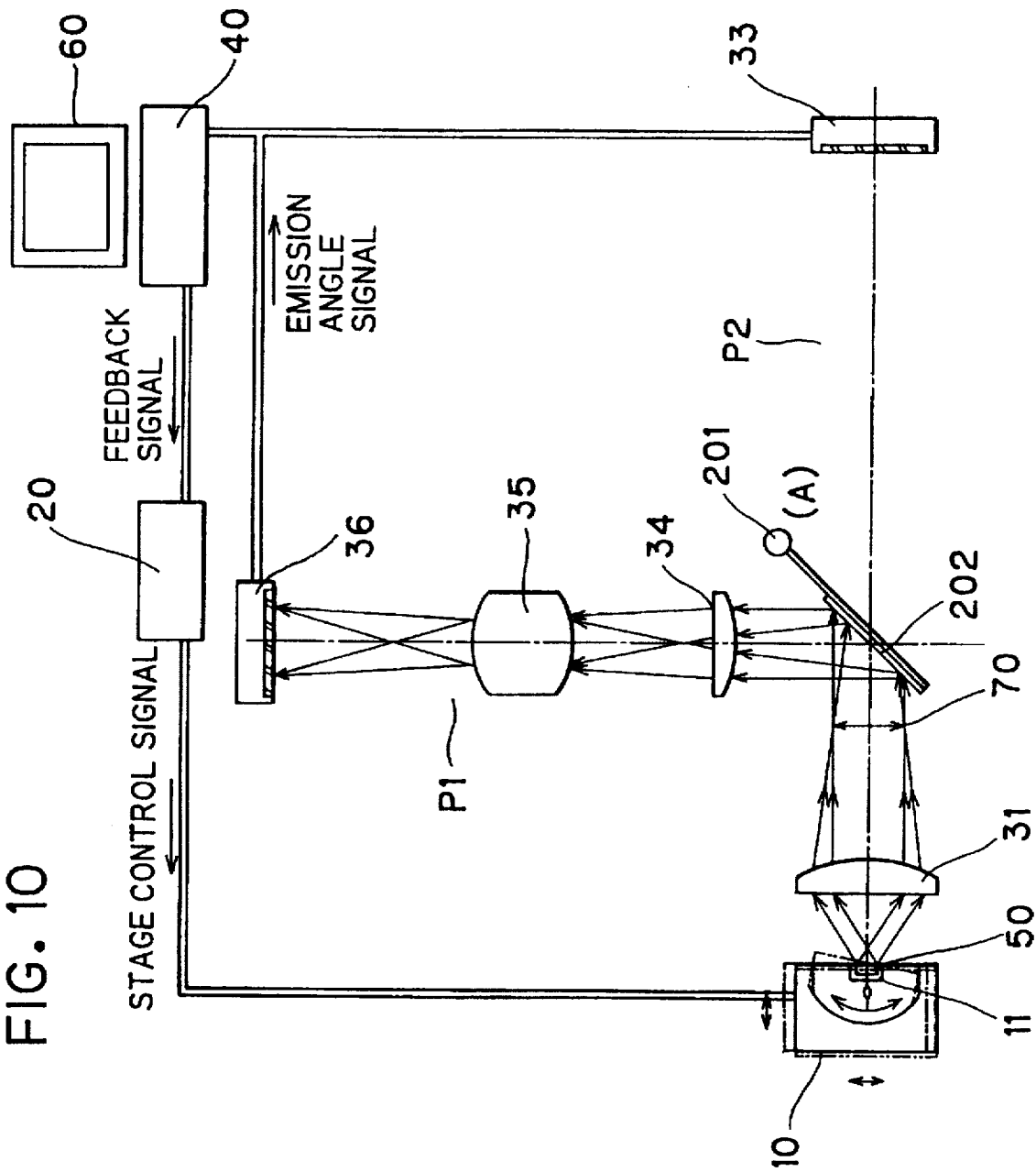
FIG. 10 is a schematic plan view showing a light source positional adjustment device according to a third embodiment of the present invention, in which a mirror 202 is in a first position.

According to the present embodiment, during the first set of processes (S102–S104), the control portion 40 controls the mirror moving mechanism 201 to locate the mirror 202 at the first position (A) shown in FIG. 10. Accordingly, the light bundle from the objective lens 31 is guided along the first optical path P1 toward the angular shift measurement pick-up element 36. In S102, the pick-up element 36 measures the angular shift amount, by which the light-emission direction is shifted from the standard direction. During S103 and S104, the light-emission direction is feedback adjusted into alignment with the standard direction.

Figure 11:
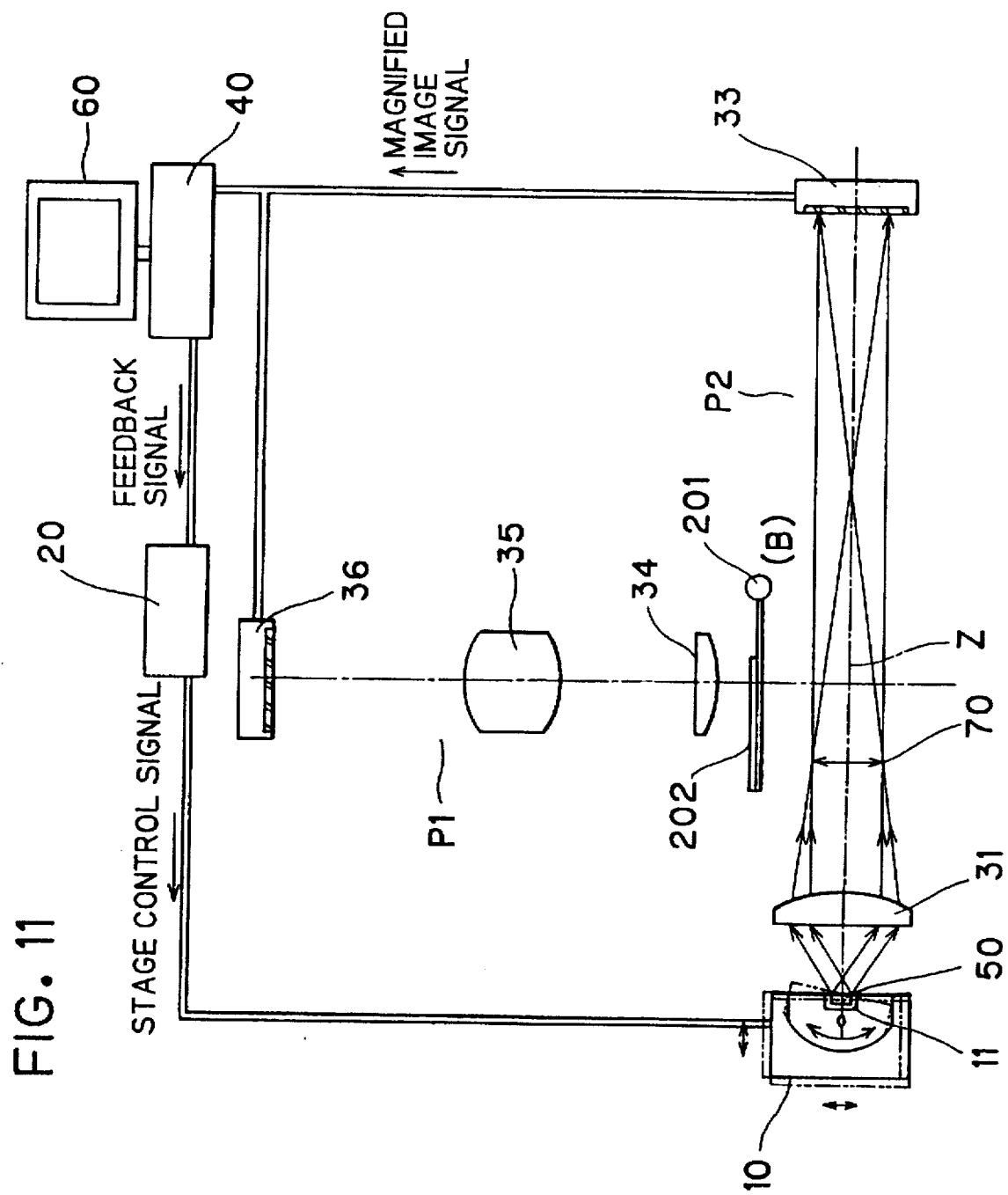
FIG. 11 is another schematic plan view of the light source positional adjustment device according to the third embodiment, in which the mirror 202 is in a second position.

When the light-emission direction is properly adjusted, the control portion 40 controls the mirror moving mechanism 201 to move the mirror 202 from the first position (A) to the second position (B) shown in FIG. 11. Then, the second set of processes S105–S107 is started. The light bundle from the objective lens 31 is guided along the second optical path P2 toward the positional shift measurement pick-up element 33. In S105, the pick-up element 33 measures the positional shift amount, by which the light-generating position is shifted from the standard position. During S106 and S107, the light-generating position is feedback adjusted onto the standard position.

Next, a light source positional adjustment device according to a fourth preferred embodiment will be described below with reference to FIGS. 12 and 13.

The device of the present embodiment is the same as that of the second embodiment except that the mirror 202 is provided in place of the half mirror 32. In the same manner as in the third embodiment, the mirror 202 is attached to the mirror moving mechanism 201. The mirror moving mechanism 201 is capable of moving the mirror 202 between the first position (A) shown in FIG. 12 and the second position (B) shown in FIG. 13. The mirror 202 at the first position (A) is located on the optical path of the light bundle from the objective lens 31. The mirror 202 at the first position (A) can therefore reflect the incident light and guide it to the first optical path P1. The mirror 202 at the second position (B) is located away from the optical path from the objective lens 31. Accordingly, the light from the objective lens 31 will travel linearly to proceed along the second optical path P2 to reach the half mirror 82. The control portion 40 controls the mirror moving mechanism 201 to switch between the first state (A) and the second state (B).

The device of the present embodiment performs the same operations as those shown in FIG. 7 in the second embodiment except for the control of the mirror moving mechanism 201 as described below.

Figure 12:
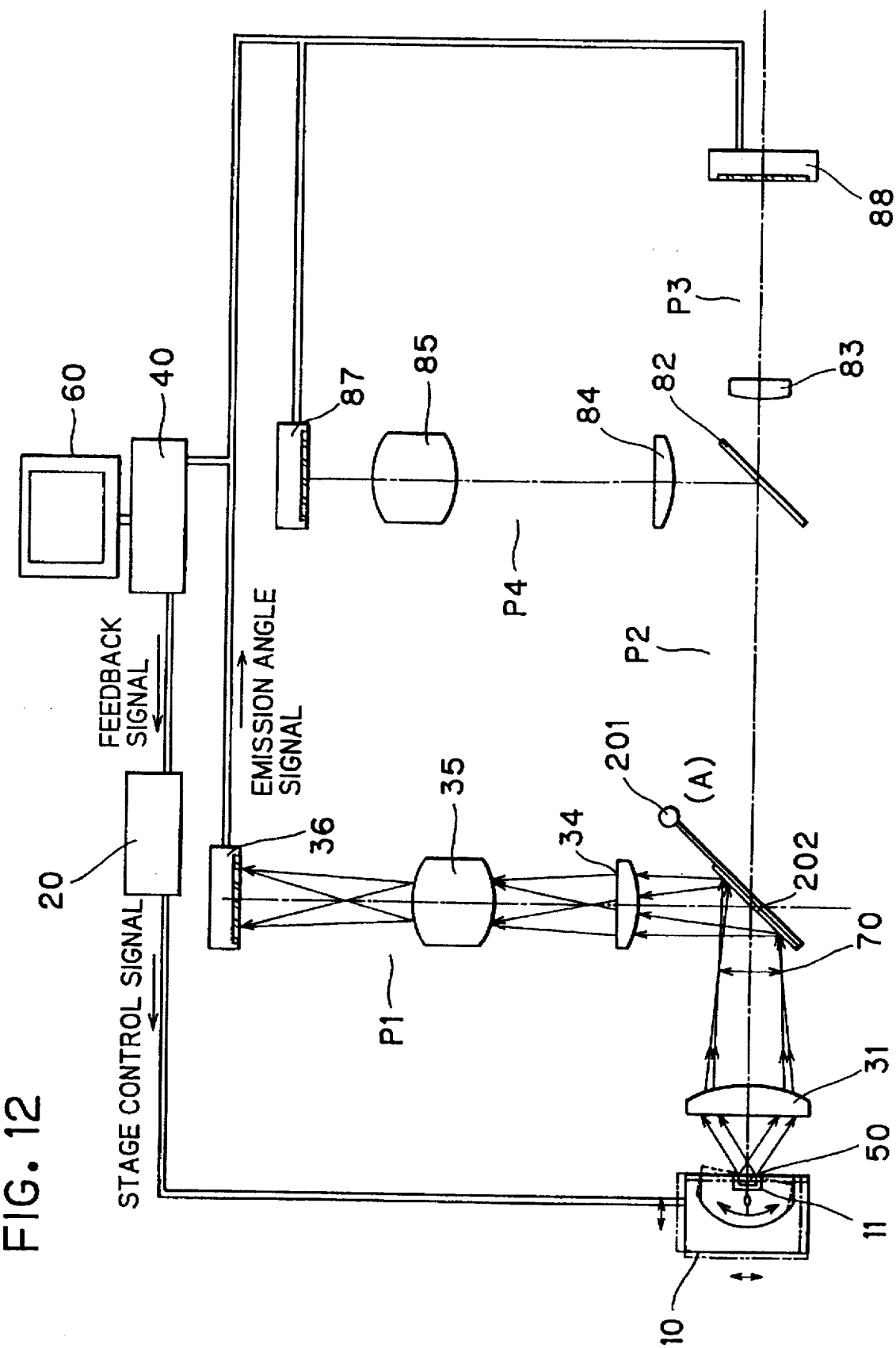
FIG. 12 is a schematic plan view showing a light source positional adjustment device according to a fourth embodiment of the present invention, in which a mirror 202 is in a first position.

According to the present embodiment, during the first set of processes (S202–S204), the control portion 40 controls the mirror moving mechanism 201 to locate the mirror 202 at the first position (A) shown in FIG. 12. Accordingly, the light bundle from the objective lens 31 is guided along the first optical path P1 toward the angular shift measurement pick-up element 36. In S202, the pick-up element 36 measures the angular shift amount, by which the light-emission direction is shifted from the standard direction. During S203 and S204, the light-emission direction is feedback adjusted into alignment with the standard direction.

Figure 13:
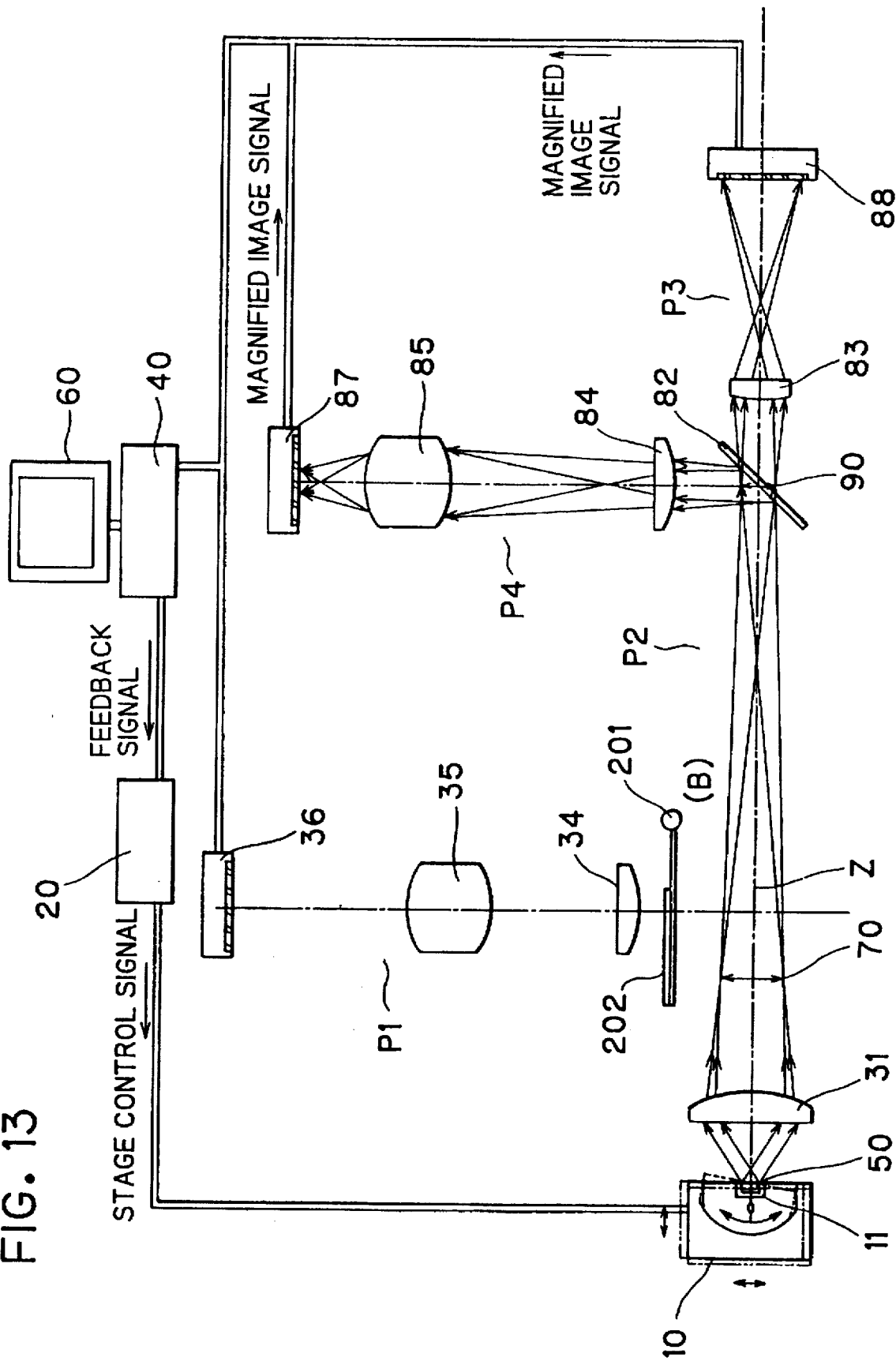
FIG. 13 is another schematic plan view of the light source positional adjustment device according to the fourth embodiment, in which the mirror 202 is in a second position.

When the light-emission direction is properly adjusted, the control portion 40 controls the mirror moving mechanism 201 to move the mirror 202 from the first position (A) to the second position (B) shown in FIG. 13. Then, the second set of processes S205–S207 is started. The light bundle from the objective lens 31 is guided along the second optical path P2 and then falls incident on the half mirror 82. A part of the light bundle that reflects off the half mirror 82 is guided toward the wide-range positional shift measurement pick-up element 87. In S205, the pick-up element 87 measures the positional shift amount, by which the light-generating position is shifted from the standard position. Through S206 and S207, the light-generating position is feedback adjusted onto the standard position.

When the light-generating position is thus roughly adjusted through S206 and S207, the third set of processes S208–S210 is started. A part of the light bundle passing through the half mirror 82 is detected by the narrow-range positional shift measurement pick-up element 88. In S208, the pick-up element 88 measures the positional shift amount, by which the light-generating position is shifted from the standard position. Through S209 and S210, the light-generating position is feedback adjusted onto the standard position. The light-generating position is thus adjusted precisely onto the standard position.

Next, a light source positional adjustment device according to a fifth preferred embodiment will be described below with reference to FIGS. 14 through 16.

The device of the present embodiment is the same as that of the second embodiment except that the mirror 202 is provided in place of the half mirror 32 and a mirror 203 is also provided in place of the half mirror 82. In the same manner as in the fourth embodiment, the mirror 202 is attached to the mirror moving mechanism 201. The mirror moving mechanism 201 is capable of moving the mirror 202 between the first position (A) shown in FIG. 14 and the second position (B) shown in FIGS. 15 and 16. The mirror 202 at the first position (A) is located on the optical path of the light bundle from the objective lens 31. The mirror 202 at the first position (A) can therefore reflect the incident light and guide it to the first optical path P1. The mirror 202 at the second position (B) is located away from the optical path from the objective lens 31. Accordingly, the light from the objective lens 31 will travel linearly to proceed along the second optical path P2. The control portion 40 controls the mirror moving mechanism 201 to switch between the first state (A) and the second state (B).

The mirror 203 is attached to a mirror moving mechanism 204. The mirror moving mechanism 204 is capable of moving the mirror 203 between a third position (C) shown in FIG. 15 and a fourth position (D) shown in FIG. 16. The mirror 203 at the third position (C) is located on the optical path of the light bundle from the objective lens 31. The mirror 203 at the third position (C) can therefore reflect the incident light and guide it to the fourth optical path P4. The mirror 203 at the fourth position (D) is located away from the optical path from the objective lens 31. Accordingly, the light from the objective lens 31 will travel linearly to proceed along the third optical path P3. The control portion 40 controls the mirror moving mechanism 204 to switch between the third state (C) and the fourth state (D).

The device of the present embodiment performs the same operations as those shown in FIG. 7 in the second embodiment except for the control of the mirror moving mechanisms 201 and 204 as described below.

Figure 14:
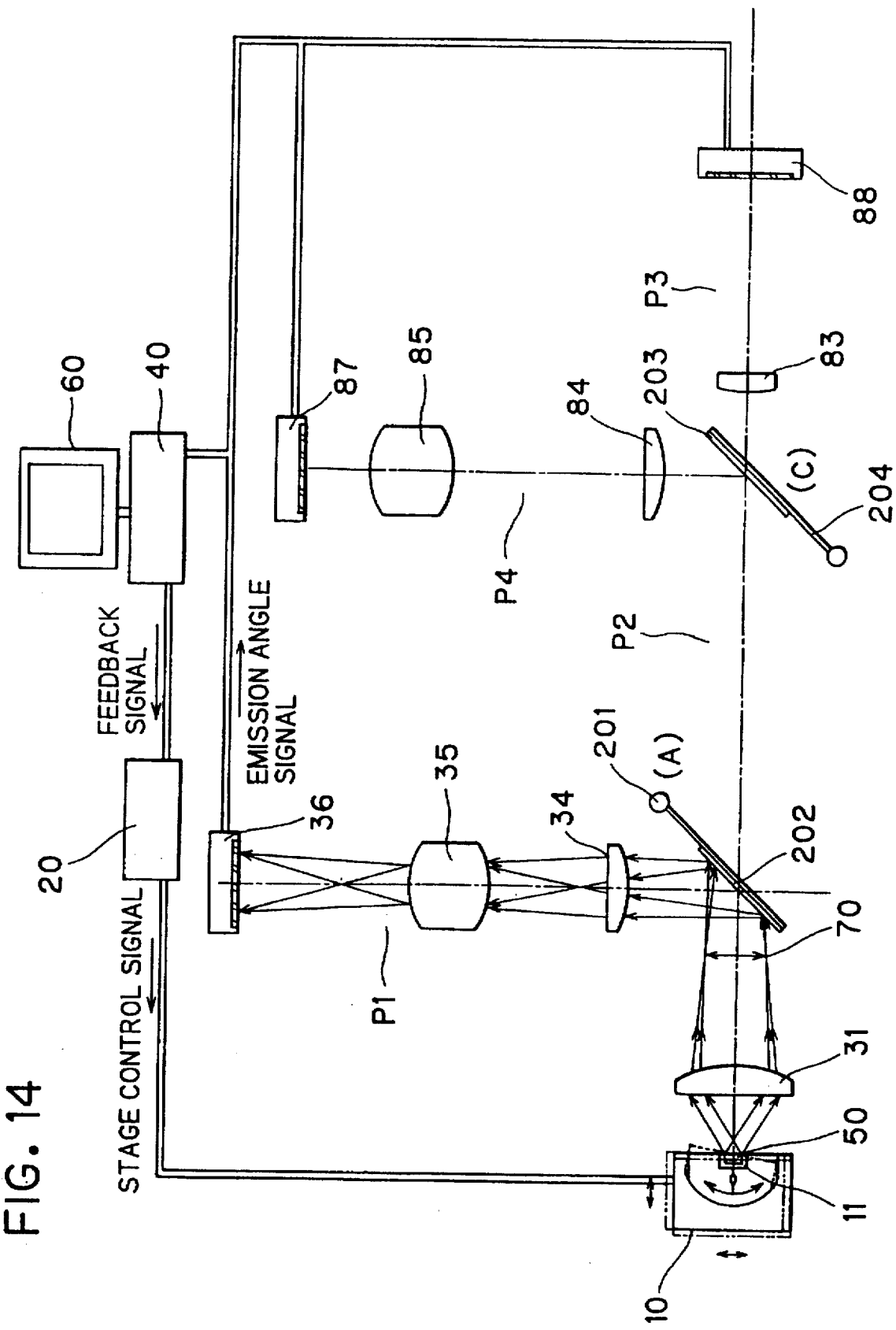
FIG. 14 is a schematic plan view showing a light source positional adjustment device according to a fifth embodiment of the present invention, in which the mirror 202 is in the first position.

According to the present embodiment, during the first set of processes (S202–S204), the control portion 40 controls the mirror moving mechanism 201 to locate the mirror 202 at the first position (A) shown in FIG. 14. Accordingly, the light bundle from the objective lens 31 is guided along the first optical path P1 toward the angular shift measurement pick-up element 36. In S202, the pick-up element 36 measures the angular shift amount, by which the light-emission direction is shifted from the standard direction. During S203 and S204, the light-emission direction is feedback adjusted into alignment with the standard direction.

Figure 15:
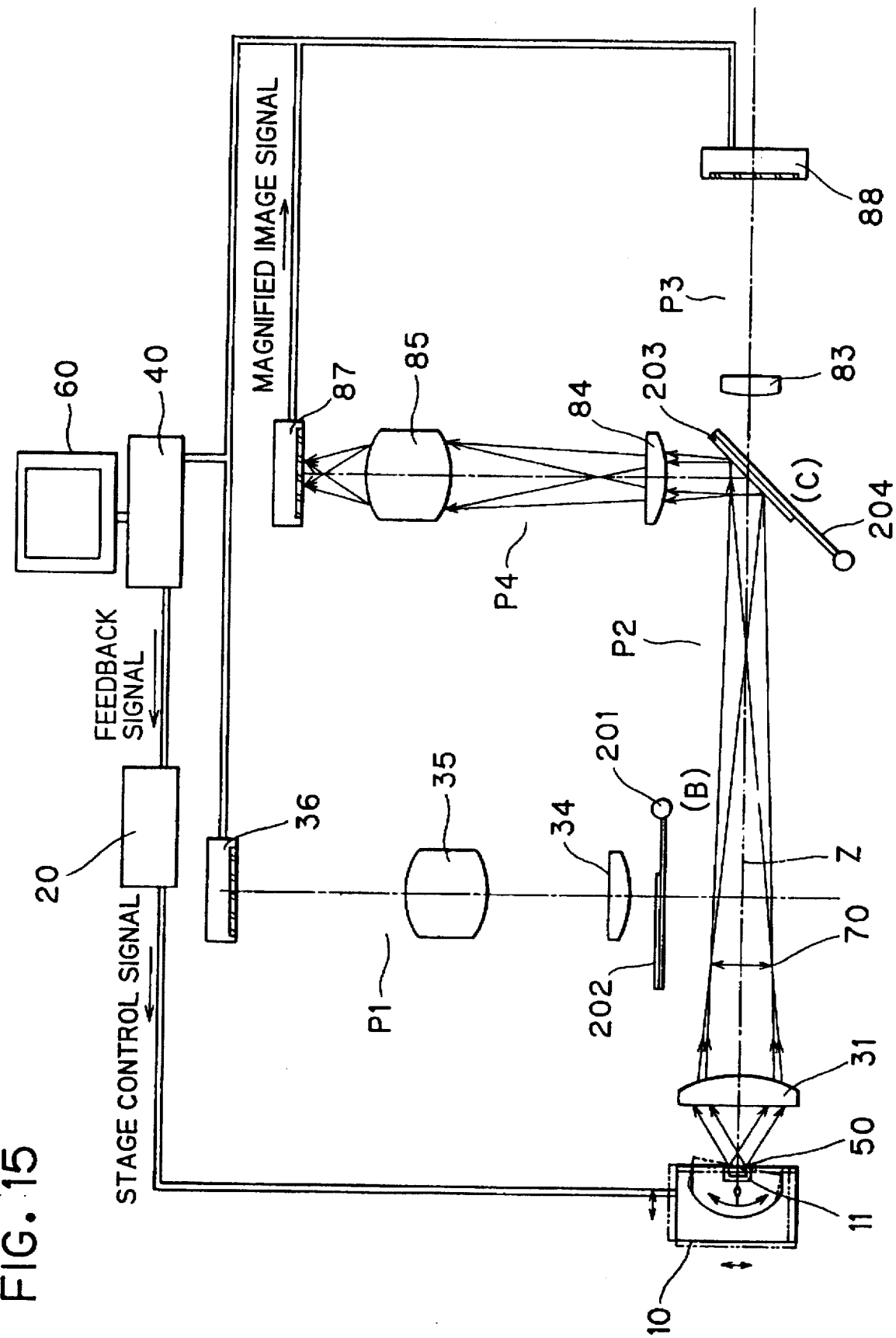
FIG. 15 is another schematic plan view of the light source positional adjustment device according to the fifth embodiment in which the mirror 202 is in the second position and a mirror 203 is in a third position.

When the light-emission direction is properly adjusted, the control portion 40 controls the mirror moving mechanism 201 to move the mirror 202 from the first position (A) to the second position (B) shown in FIG. 15. Then, the control portion 40 controls the mirror moving mechanism 204 to locate the mirror 203 at the third position (C) shown in FIG. 15. Then, the second set of processes S205–S207 is started. The light bundle from the objective lens 31 is guided along the second optical path P2 and then falls incident on the mirror 203. The light bundle reflects off the mirror 203 and is guided toward the wide-range positional shift measurement pick-up element 87. In S205, the pick-up element 87 measures the positional shift amount, by which the light-generating position is shifted from the standard position. Through S206 and S207, the light-generating position is feedback adjusted onto the standard position.

Figure 16:
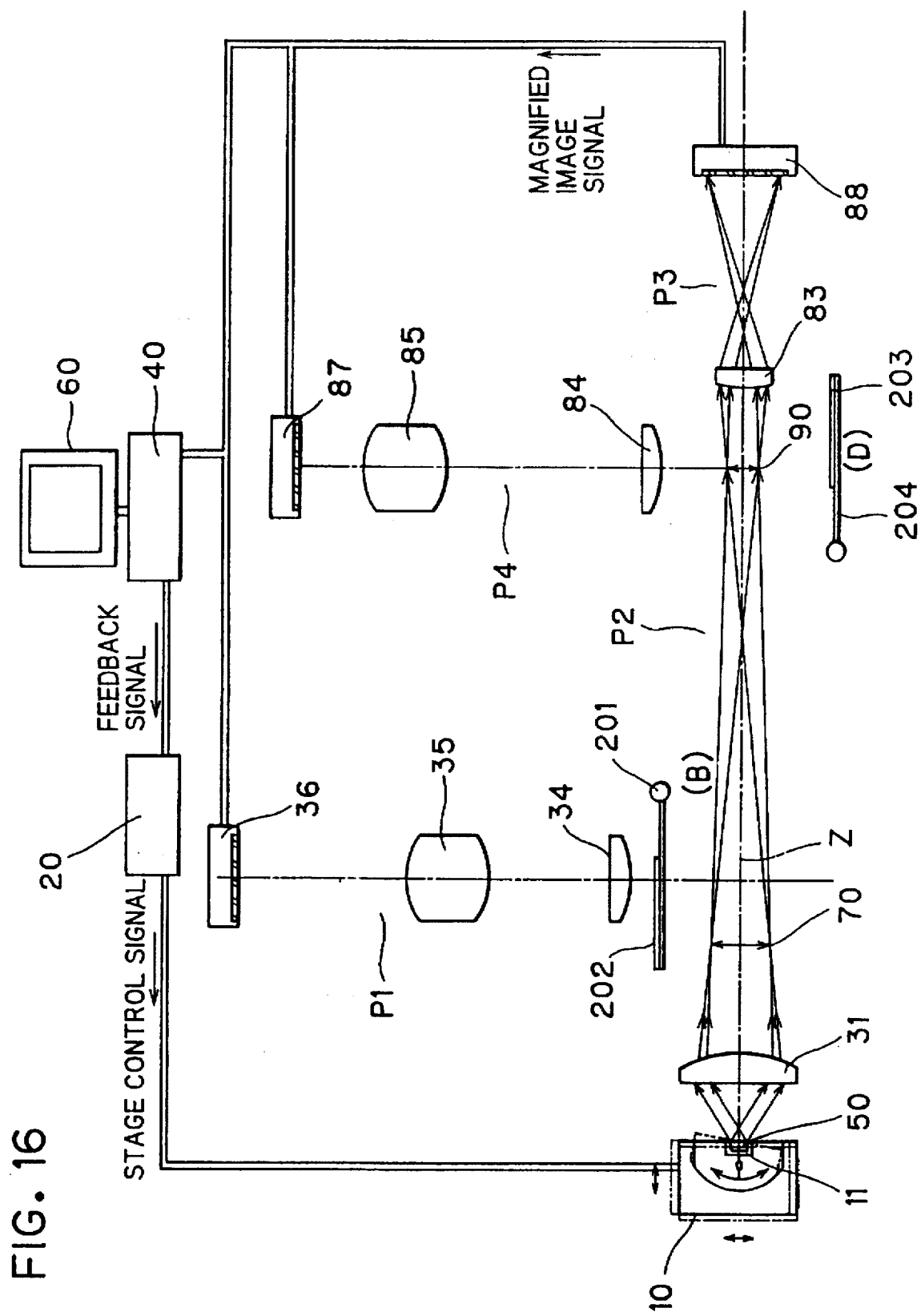
FIG. 16 is another schematic plan view of the light source positional adjustment device according to the fifth embodiment in which the mirror 202 is in the second position and the mirror 203 is in a fourth position.

When the light-generating position is thus roughly adjusted through S206 and S207, the control portion 40 controls the mirror moving mechanism 204 to move the mirror 203 from the third position (C) to the fourth position (D) shown in FIG. 16. Then, the third set of processes S208–S210 is started. The light bundle from the objective lens 31 is guided along the second optical path P2 and then further travels linearly to the narrow-range positional shift measurement pick-up element 88. In S208, the pick-up element 88 measures the positional shift amount, by which the light-generating position is shifted from the standard position. Through S209 and S210, the light-generating position is feedback adjusted onto the standard position. The light-generating position is thus adjusted precisely onto the standard position.

While the invention has been described in detail with reference to specific, embodiments thereof, it would be apparent to those skilled in the art that various changes and modifications may be made therein without departing from the spirit of the invention, the scope of which is defined by the attached claims.

For example, in the above description, a CCD camera is used as each of the positional shift measurement pick-up elements 33, 87, and 88 and the angular shift measurement pick-up element 36. However, each of the elements 33, 87, 88, and 36 may be constructed from a position sensitive light detector (PSD). In this case, the peak (center of gravity) of each of the images I1 and I2 can be directly detected.

The light source 50 may not be a semiconductor laser, but may be constructed from other various types of light sources.

As described above, according to the present invention, the light source is mounted on the multi-axes stage unit. When the light source is driven, a light bundle emitted from the light source falls incident on the magnifying lens system, and then travels while being magnified. The light bundle falls incident on the first optical path setting unit, and then travels both in the first and second optical path.

In the first optical path, the light bundle falls incident on the angular shift measuring portion. The angular shift measuring portion measures emission angle intensity distribution of the light bundle, and outputs information on the emission angle intensity distribution of the light source to the control portion. Based on the information, the control portion calculates an amount, with which a direction in which the light source emits light shifts from the predetermined standard direction.

In the second optical path, the light bundle falls incident on the positional shift measuring portion. The position shift measuring portion measures a magnification image of the light source, and outputs information on the magnification image of the light source to the control portion. Based on the information, the control portion calculates an amount, with which a light-generating point of the light source is displaced from the standard position.

Based on the calculated angular shift amount and displacement amount, the control portion calculates a driving direction and a driving amount in and with which the multi-axes stage unit is to be moved in order that the light-generating point will coincide with the standard position and in order that the light-emission direction will be aligned with the standard direction. The control portion then supplies the stage drive unit with the control signal indicative of the calculated driving information. Receiving the control signal, the stage drive unit transmits a drive signal to the multi-axes stage unit so that the multi-axes stage unit will be driven as instructed by the control portion. As a result, the light-emission direction is aligned with the standard direction, and the light-generating point is located on the standard position.

In the first embodiment, the first optical path setting unit divides the light bundle emitted from the magnification lens system into two bundle portions, and guides the divided light bundle portions along the first optical path and the second optical path. In this case, the light emitted from the light source can be measured simultaneously by the angular shift measuring portion and the positional shift measuring portion.

In the third embodiment, the first optical path setting portion switches between guiding the light bundle toward the first optical path and toward the second optical path. The control portion may control a switching timing at which the first optical path setting portion switches. When the first optical path setting portion switches to guide the light bundle along the first optical path, the angular shift measuring portion measures the angular shift amount. When the first optical path setting portion switches to guide the light bundle along the second optical path, the position shift measuring portion measures the positional shift amount. The control portion controls the switching timing so that after one of the angular shift amount and the positional shift amount is measured, the other one is measured. Based on these measured results, the multi-axes stage unit is controlled.

For example, this first optical path setting unit is constructed from a mirror and a mirror moving mechanism. The mirror moving mechanism is capable of moving the mirror to locate the mirror at a position on the optical path of the light bundle emitted from the light source. The mirror moving mechanism locates the mirror on the optical path, whereby the incident light will reflect off the mirror. The mirror moving mechanism moves the mirror away from the optical path, whereby the incident light will travel linearly. The control portion controls the mirror moving timing.

According to the first embodiment, in the angular shift measuring portion, the first optical system, such as a lens system constructed from the field lens and the relay lens, is disposed in the first optical path for re-imaging an emission angle intensity distribution of the light source produced at a back focal plane of the magnification lens. A first light detector, such as a two-dimensional optical sensor (CCD camera, PSD, and the like), is disposed for detecting the emission angle intensity distribution re-imaged by the first optical system.

With this structure, when the light bundle is guided to the first optical path by the first optical path setting unit, the light bundle first falls incident on the first optical system. An emission angle intensity distribution of the light source is produced at a back focal plane of the magnification lens. The first optical system re-images the emission angle intensity distribution onto the light reception surface of the first optical detector. The first optical detector measures the emission angle intensity distribution, and supplies the control portion with a signal indicative of the emission angle intensity distribution information. Based on the signal, the control portion will calculate the angular shift amount of the light-emission direction.

The displacement measuring portion may include a second light detector, such as a two-dimensional light detector (CCD camera, PSD, and the like) disposed in the second optical path. The second light detector is for detecting a magnification image of the light source produced at an imaging plane of the magnification lens system.

With this structure, when the light bundle is guided to the second optical path by the first optical path setting unit, the light bundle is imaged on the image plane of the magnification lens system. The light detector is disposed so that its light reception surface is located on the image plane. Accordingly, the light bundle is imaged on the reception surface of the second light detector. The second light detector detects the magnification image of the light source, and supplies the control portion with a signal indicative of the magnification image. Based on the signal, the control portion calculates the positional shift amount of the light-generating point from the standard position.

According to the second embodiment, in the displacement measuring portion, a second light path setting unit is disposed in the second optical path. The second light path setting unit is disposed on a spatial magnification imaging plane of the magnification lens system. The second light path setting unit guides the light bundle emitted from the magnification lens system along both a wide-range measuring optical path and a narrow-range measuring optical path. A wide-range measuring portion is disposed in the wide-range measuring optical path. The wide-range measuring portion is for detecting a magnified spatial image which is originated from an entire field of the magnification lens system and which includes a magnified spatial image of the light source. The narrow-range measuring portion is disposed in the narrow-range measuring optical path. The narrow-range measuring portion is for detecting a magnified spatial image which is originated from only a part of the field of the magnification lens system and which includes only a magnified spatial image of the light source.

With this structure, when the light bundle is guided to the second optical path by the first path setting unit, the light bundle falls incident on the second optical path setting unit to be guided along both the wide-range measuring optical path and the narrow-range measuring optical path. The wide-range measuring portion receives the light bundle travelling along the wide-range measuring optical path, and detects a magnified spatial image which is originated from the entire field of the magnification lens system and which includes a magnified spatial image of the light source. The wide-range measuring portion supplies the control portion with a signal indicative of the magnified spatial image. Based on the supplied signal, the control portion calculates the positional shift amount of the light-generating point from the standard position. Based on the calculated results, the control portion controls the multi-axes stage unit to roughly adjust the light-generating position of the light source.

The narrow-range measuring portion receives the light bundle travelling along the narrow-range measuring optical path, and detects a magnified spatial image which is originated from only a part of the field of the magnification lens system and which includes only a magnified spatial image of the light source. The narrow-range measuring portion supplies the control portion with a signal indicative of the magnified spatial image. Based on the supplied signal, the control portion calculates the positional shift amount of the light-generating point from the standard position with a greater accuracy. Based on the calculated results, the control portion controls the multi-axes stage unit to finely adjust the light-generating position of the light source.

As apparent from the above description, the position of the light source is adjusted based on measurements of both a wide range and a narrow range of the light source image. That is, the light source is first adjusted roughly based on the wide range measurement. The light source is then adjusted finely based on the narrow range measurement. The light-generating point can therefore be adjusted with high accuracy.

According to the second embodiment, the second optical path setting unit divides the light bundle emitted from the magnification lens system into two bundle parts, and guides the divided light bundle parts along both the wide-range measuring optical path and the narrow-range measuring optical path. In this case, the light emitted from the light source can be measured simultaneously by the wide-range measuring portion and the wide-range measuring portion.

In the fifth embodiment, the second optical path setting portion switches between guiding the light bundle toward the wide-range measuring optical path and the narrow-range measuring optical path. The control portion may control a switching timing at which the second optical path setting portion switches. When the second optical path setting portion switches to guide the light bundle along the wide-range measuring optical path, the wide-range measuring portion measures the positional shift amount. When the second optical path setting portion switches to guide the light bundle along the narrow-range measuring optical path, the narrow-range measuring portion measures the positional shift amount. The control portion controls the switching timing so that after one of the measurements in the wide and narrow ranges is attained, the other measurement is attained. Based on these measured results, the multi-axes stage unit is controlled.

For example, this second optical path setting unit is constructed from a mirror and a mirror moving mechanism. The mirror moving mechanism is capable of moving the mirror to locate the mirror at a position on the second optical path of the light bundle emitted from the light source. The mirror moving mechanism locates the mirror on the second optical path, whereby the incident light will reflect off the mirror. The mirror moving mechanism moves the mirror away from the optical path, whereby the incident light will travel linearly The control portion controls the mirror moving timing.

As described above in detail, with the light source positional adjustment device of the present invention, there is no need to adjust the position of the light source before measuring the axial angular shift. Measurement of the axial shift angle and the amount of displacement between the light-generating point and a standard position can be performed in real time within a short period of time. Therefore, the light emission direction of the light source and the light-generating point position can be quickly aligned with a predetermined standard optical axis and a standard position, respectively. By using the device of the present invention, a light source can be precisely mounted to a housing. It, becomes possible to provide a light emitting body, wherein little variation exists in position and direction of emitted beams. The light source can be easily and effectively connected to another optical element.

Further, the positional shift measurement portion preferably includes a wide-range measurement portion and a narrow-range measurement portion. After roughly adjusting the position of the light source based on detection results from the wide-range measurement portion, fine adjustments of the light source position can be performed based on detection results from the narrow-range measurement portion. Therefore, the light-generating point position can be aligned with the standard position with great accuracy.

What is claimed is:

1. A light-source position adjustment device for aligning, with a predetermined standard direction, a direction in which a light source emits light and for positioning a light emission point on a predetermined standard position, the device comprising:

a magnification lens system for magnifying a light bundle emitted from a light source;

first optical path setting means for guiding a light bundle magnified at the magnification lens system toward first and second optical paths;

angular shift measuring means disposed in the first optical path and for detecting emission angle intensity distribution of the light source;

position shift measuring means disposed in the second optical path and for detecting a magnification image of the light source produced on an image plane of the magnification lens;

a multi-axes stage unit including means for producing parallel movement and swinging movement of the light source;

stage drive means for transmitting a drive signal to the multi-axes stage unit; and control means for determining, based on an output signal from the angular shift measuring means, an amount that a direction in which the light source emits light shifts from the predetermined standard direction and for determining, based on an output signal from the position shift measuring means, an amount that a light-generating point of the light source is displaced from the standard position, the control means outputting control signals to the stage drive means.

2. A light-source position adjustment device as claimed in claim 1 wherein the first optical path setting means divides the light bundle emitted from the magnification lens system and guides the divided light bundle toward the first optical path and the second optical path.

3. A light-source position adjustment device as claimed in claim 1 wherein the first optical path setting means receives the light bundle emitted from the magnification lens system and switches between guiding the light bundle toward the first optical path and the second optical path, and wherein the control means controls switching timing to thereby measure the angle shift amount and the displacement amount.

4. A light-source position adjustment device as claimed in claim 1 wherein the angular shift measuring means includes:

a first optical system disposed in the first optical path and for re-imaging the emission angle intensity distribution of the light source generated at a back focal plane of the magnification lens; and a first light detector for detecting the emission angle intensity distribution re-imaged by the first optical system.

5. A light-source position adjustment device as claimed in claim 1 wherein the position shift measuring means includes a second light detector disposed in the second optical path and for detecting a magnified image of the light source generated at the image plane of the magnification lens system.

6. A light-source position adjustment device as claimed in claim 1 wherein the position shift measuring means includes:

second light path setting means disposed in the image plane of the magnification lens system in the second optical path and for guiding the light bundle emitted from the magnification lens system along a wide-range measuring optical path and a narrow-range measuring optical path;

wide-range measuring means disposed in the wide-range measuring optical path and for detecting a spatial magnification image of the light source originated from an entire field of the magnification lens system; and narrow-range measuring means disposed in the narrow-range measuring optical path and for detecting a spatial magnification image of the light source originated from a part of the field of the magnification lens system.

7. A light-source position adjustment device as claimed in claim 6 wherein the second optical path setting means separates the optical bundle emitted from the magnification lens system and guides the divided optical bundle along the wide-range measuring optical path and the narrow-range measuring optical path.

8. A light-source position adjustment device as claimed in claim 7 wherein the second optical path setting means receives the optical bundle emitted from the magnification lens system and switching guides the optical bundle along the wide-range measuring optical path and the narrow-range measuring optical path, and wherein the control means controls a first switch timing of the second optical path setting means for guiding the optical bundle to the wide-range measuring optical path and for causing the wide-range measuring means to roughly determine the amount that the light-generating point of the light source is displaced from the standard position, the control portion roughly controlling the stage drive means based on the determined result, and wherein the control means controls a second switch timing of the second optical path setting means for guiding the optical bundle to the narrow-range measuring optical path and for causing the narrow-range measuring means to finely determine the amount that the light-generating point of the light source is displaced from the standard position, the second switch timing being after the first switch timing, the control portion finely controlling the stage drive means based on the determined result.

* * * * *

UNITED STATES PATENT AND TRADEMARK OFFICE
CERTIFICATE OF CORRRECTION

PATENT NO. : 5,700,084
DATED : December 23, 1997
INVENTOR(S) : Manabu Yasukawa, et al.

Page 1 of 2

It is certified that error appears in the above-identified patent and that said Letters Patent is hereby corrected as shown below:

On the title page insert the following under item [56]:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 4 | 5 | 6 | 2 | 3 | 5 | 0 | 12/31/85 | Thirouard et al. | | | |
| | | 4 | 6 | 0 | 1 | 4 | 5 | 2 | 7/22/86 | Rando | | | |
| | | | | | | | | | | | | | |

FOREIGN PATENT DOCUMENTS

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 0 | 5 | 5 | 5 | 8 | 7 | 2 | 8/18/93 | Europe | | | | |
| | | | | | | | | | | | | | | |

UNITED STATES PATENT AND TRADEMARK OFFICE
CERTIFICATE OF CORRRECTION

PATENT NO. : 5,700,084
DATED : December 23, 1997
INVENTOR(S) : Manabu Yasukawa, et al.

Page 2 of 2

It is certified that error appears in the above-identified patent and that said Letters Patent is hereby corrected as shown below:

OTHER DOCUMENTS

| | | |
|---|---|---|
| | PATENT ABSTRACTS OF JAPAN, vol. 095, no. 001, 2/28/95 & JP 06 283819 | |
| | A (NEC CORP; OTHERS: 01) 10/19/94 *ABSTRACT | |
| | PATENT ABSTRACTS OF JAPAN, vol. 095, no. 004, 5/31/95 & JP 07 005032 A | |
| | (MITSUBISHI ELECTRIC CORP) 1/19/95 *ABSTRACT | |
| | PATENT ABSTRACTS OF JAPAN, vol. 018, no. 603 (E-1632), 11/16/94 & JP 06 232507 | |
| | A (SHARP CORP), 8/19/94 *ABSTRACT | |
| | PATENT ABSTRACTS OF JAPAN vol. 095, no. 005, 6/30/95 & JP 07 038201 | |
| | A (SHARP CORP), 2/19/95 *ABSTRACT | |

Signed and Sealed this

Twenty-seventh Day of April, 1999

Attest:

Q. TODD DICKINSON

*Attesting Officer*          *Acting Commissioner of Patents and Trademarks*